United States Patent
Zhang et al.

(10) Patent No.: US 11,075,219 B2
(45) Date of Patent: Jul. 27, 2021

(54) MEMORY ARRAYS AND METHODS USED IN FORMING A MEMORY ARRAY COMPRISING STRINGS OF MEMORY CELLS

(71) Applicant: Micron Technology, Inc., Boise, ID (US)

(72) Inventors: Xiaosong Zhang, Boise, ID (US); Yi Hu, Boise, ID (US); Tom J. John, Boise, ID (US); Wei Yeeng Ng, Boise, ID (US); Chandra Tiwari, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/545,375

(22) Filed: Aug. 20, 2019

(65) Prior Publication Data

US 2021/0057433 A1    Feb. 25, 2021

(51) Int. Cl.
| | |
|---|---|
| *H01L 27/11582* | (2017.01) |
| *H01L 27/11556* | (2017.01) |
| *H01L 27/11565* | (2017.01) |
| *H01L 21/311* | (2006.01) |
| *H01L 27/11519* | (2017.01) |

(52) U.S. Cl.
CPC ... *H01L 27/11582* (2013.01); *H01L 21/31111* (2013.01); *H01L 27/11519* (2013.01); *H01L 27/11556* (2013.01); *H01L 27/11565* (2013.01)

(58) Field of Classification Search
CPC ......... H01L 27/11582; H01L 27/11519; H01L 27/11556; H01L 27/11565; H01L 21/31111

USPC ......................................................... 257/314
See application file for complete search history.

(56) References Cited

U.S. PATENT DOCUMENTS

| | | | |
|---|---|---|---|
| 8,492,278 | B2 | 7/2013 | Good et al. |
| 8,735,216 | B2 | 3/2014 | Liu et al. |
| 8,980,752 | B2 | 3/2015 | Good et al. |
| 9,786,673 | B1 | 10/2017 | Cho et al. |
| 9,893,083 | B1 | 2/2018 | Wang et al. |
| 10,014,309 | B2 | 7/2018 | Dorhout et al. |
| 10,381,377 | B2 | 8/2019 | Wang et al. |
| 10,388,665 | B1 | 8/2019 | Xie et al. |
| 2008/0014761 | A1 | 1/2008 | Bhatia et al. |

(Continued)

OTHER PUBLICATIONS

U.S. Appl. No. 16/728,962, filed Dec. 27, 2019, by Scarbrough et al.

(Continued)

*Primary Examiner* — Dzung Tran
(74) *Attorney, Agent, or Firm* — Wells St. John P.S.

(57) ABSTRACT

In some embodiments, a memory array comprising strings of memory cells comprise laterally-spaced memory blocks individually comprising a vertical stack comprising alternating insulative tiers and conductive tiers. Operative channel-material strings of memory cells extend through the insulative tiers and the conductive tiers. Insulative pillars are laterally-between and longitudinally-along immediately-laterally-adjacent of the memory blocks. The pillars comprise vertically-spaced and radially-projecting insulative rings in the conductive tiers as compared to the insulative tiers. Other embodiments, including methods, are disclosed.

20 Claims, 24 Drawing Sheets

(56) References Cited

U.S. PATENT DOCUMENTS

| | | | |
|---|---|---|---|
| 2011/0298013 A1* | 12/2011 | Hwang | H01L 27/088 257/208 |
| 2012/0052672 A1 | 3/2012 | Nakanishi et al. | |
| 2012/0098050 A1* | 4/2012 | Shim | H01L 27/11578 257/324 |
| 2013/0009236 A1* | 1/2013 | Lee | H01L 27/11578 257/329 |
| 2013/0140623 A1 | 6/2013 | Lee et al. | |
| 2015/0206900 A1 | 7/2015 | Nam et al. | |
| 2015/0318301 A1* | 11/2015 | Lee | H01L 29/7926 257/324 |
| 2015/0340377 A1 | 11/2015 | Lee | |
| 2016/0204117 A1 | 7/2016 | Liu et al. | |
| 2016/0268302 A1* | 9/2016 | Lee | H01L 27/11565 |
| 2016/0343726 A1 | 11/2016 | Yune | |
| 2017/0148805 A1 | 5/2017 | Nishikawa et al. | |
| 2017/0278859 A1* | 9/2017 | Sharangpani | H01L 27/11582 |
| 2018/0047739 A1 | 2/2018 | Dorhout et al. | |
| 2018/0130814 A1 | 5/2018 | Lee | |
| 2018/0261615 A1 | 9/2018 | Minemura | |
| 2018/0294273 A1 | 10/2018 | Liao et al. | |
| 2018/0342528 A1 | 11/2018 | Lee | |
| 2019/0019724 A1 | 1/2019 | Cheng et al. | |
| 2019/0067182 A1 | 2/2019 | Lee | |
| 2019/0088671 A1 | 3/2019 | Greenlee et al. | |
| 2019/0237476 A1 | 8/2019 | Lee et al. | |
| 2019/0312054 A1 | 10/2019 | Yun et al. | |
| 2019/0363100 A1 | 11/2019 | Lee et al. | |
| 2020/0098781 A1 | 3/2020 | Xiao | |
| 2020/0127005 A1 | 4/2020 | Otsu et al. | |
| 2020/0194373 A1 | 6/2020 | Baek et al. | |
| 2020/0295031 A1 | 9/2020 | Lue | |
| 2020/0312863 A1 | 10/2020 | Iwai et al. | |
| 2020/0388629 A1 | 12/2020 | Lee et al. | |
| 2021/0043647 A1 | 2/2021 | Kim et al. | |

OTHER PUBLICATIONS

U.S. Appl. No. 16/739,581, filed Jan. 10, 2020, by Tiwari.

Jang et al., "Vertical Cell Array using TCAT (Terabit Cell Array Transistor) Technology for Ultra High Density NAND Flash Memory", IEEE, Symposium on VLSI Technology Digest of Technical Papers, United States, 2009, pp. 192-193.

U.S. Appl. No. 16/550,252, filed Aug. 25, 2019 by Xu et al.
U.S. Appl. No. 16/657,498, filed Oct. 18, 2019 by King et al.
U.S. Appl. No. 16/663,683, filed Oct. 25, 2019 by Machkaoutsan et al.
U.S. Appl. No. 16/664,618, filed Oct. 25, 2019 by Hu et al.
U.S. Appl. No. 16/599,856, filed Oct. 11, 2019 by Billingsley et al.
U.S. Appl. No. 16/550,238, filed Aug. 25, 2019 by Hu et al.
U.S. Appl. No. 16/550,244, filed Aug. 25, 2019 by Tessariol et al.
U.S. Appl. No. 16/550,250, filed Aug. 25, 2019 by Greenlee et al.

* cited by examiner

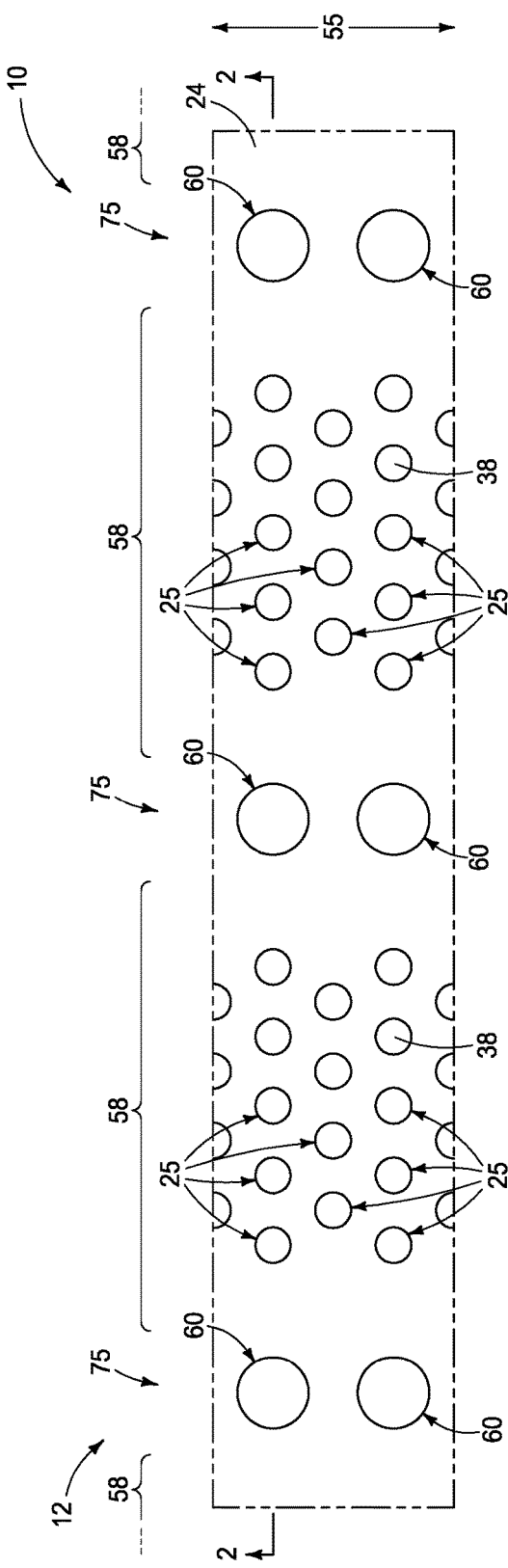
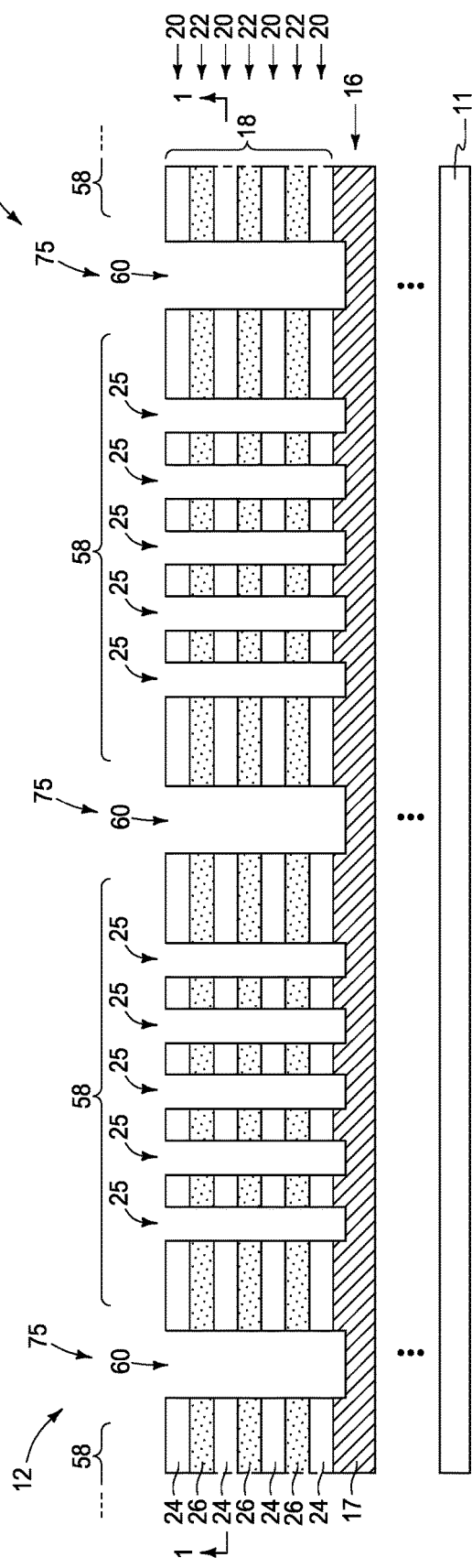
FIG. 1
FIG. 2

MEMORY ARRAYS AND METHODS USED IN FORMING A MEMORY ARRAY COMPRISING STRINGS OF MEMORY CELLS

TECHNICAL FIELD

Embodiments disclosed herein pertain to memory arrays and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228659, 2016/0267984, and 2017/0140833, and which are hereby and herein fully incorporated by reference and aspects of which may be used in some embodiments of the inventions disclosed herein. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

BRIEF DESCRIPTION OF THE DRAWINGS

FIG. 1 is a diagrammatic cross-sectional view of a portion of a substrate in process in accordance with an embodiment of the invention and is taken through line 1-1 in FIG. 2.

FIG. 2 is a diagrammatic cross-sectional view taken through line 2-2 in FIG. 1.

DETAILED DESCRIPTION OF EXAMPLE EMBODIMENTS

Figure 3:
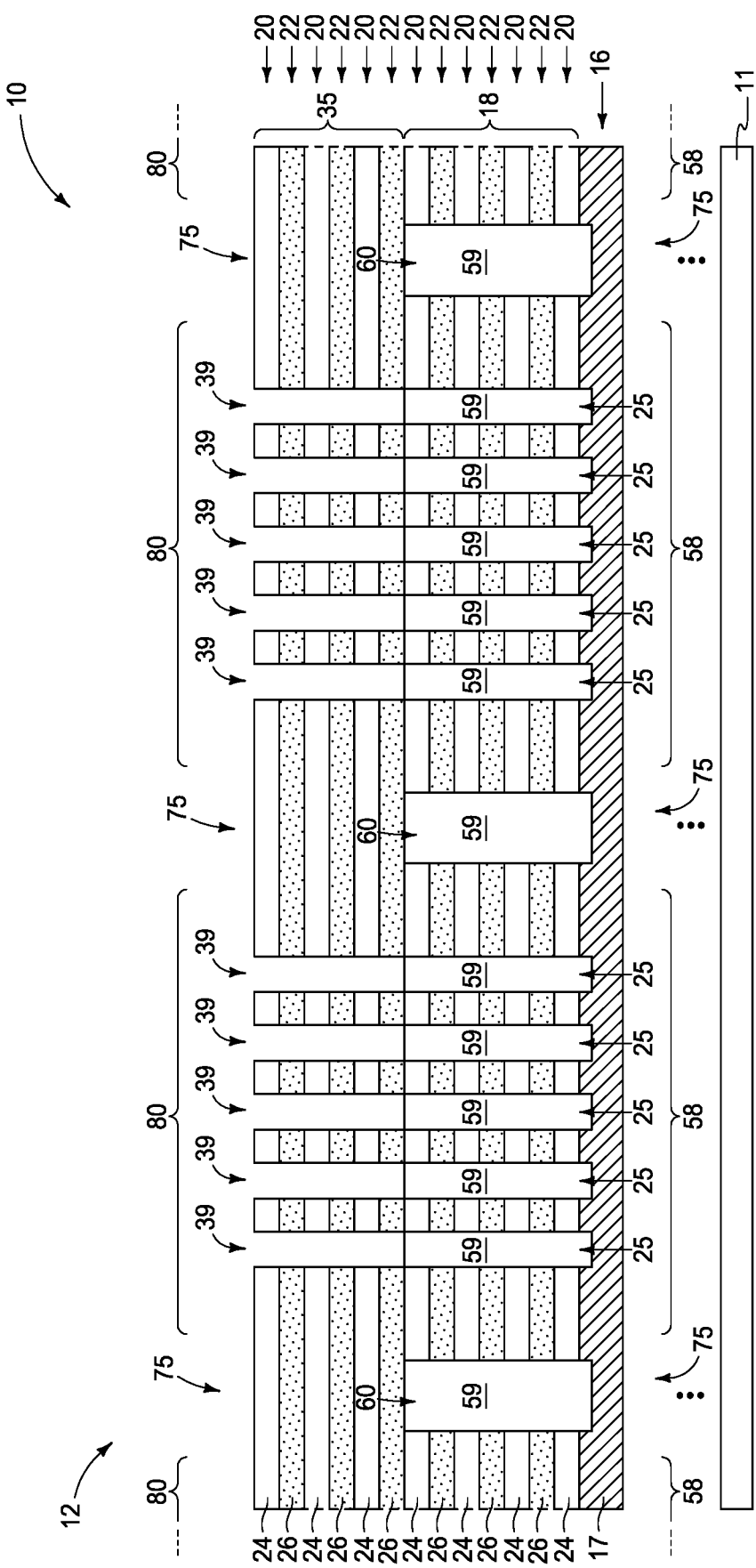
FIGS. 3, 4, 4A, 5, 5A, and 6-20 are diagrammatic sequential sectional and/or enlarged views of the construction of FIGS. 1 and 2, or portions thereof, in process in accordance with some embodiments of the invention.
Figure 4:
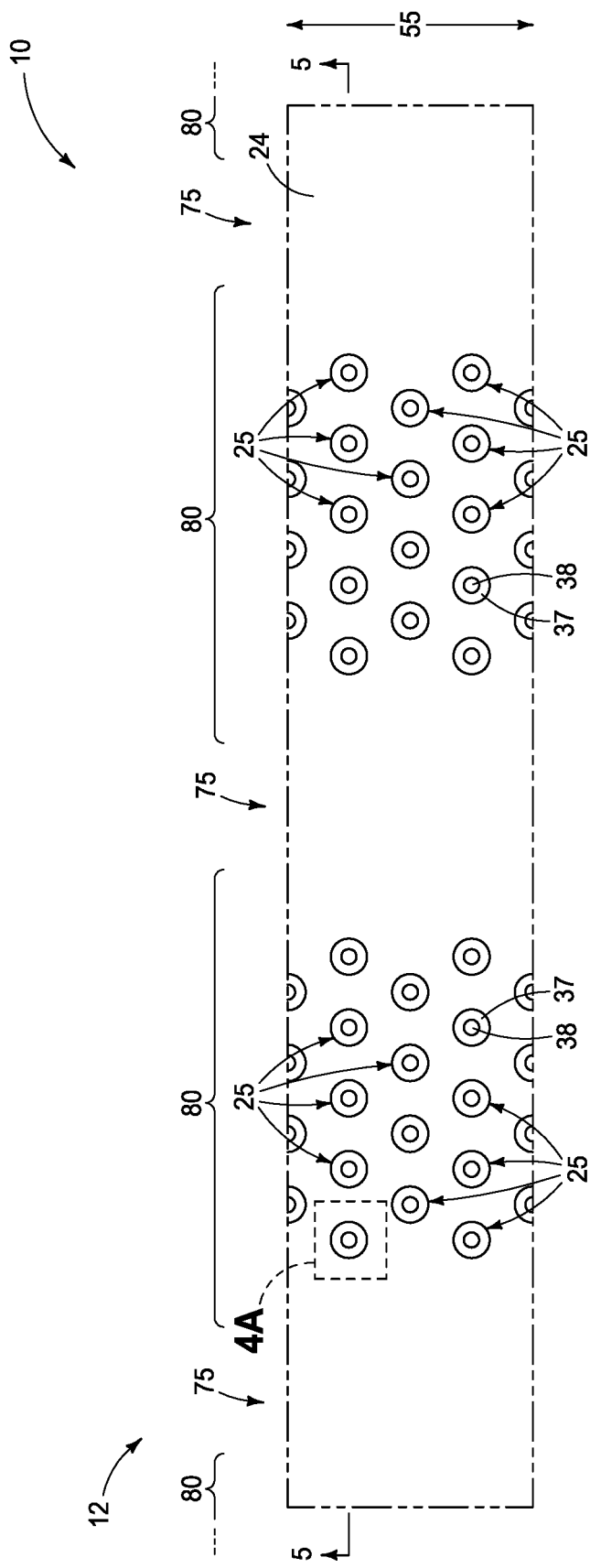
Figure 5A:
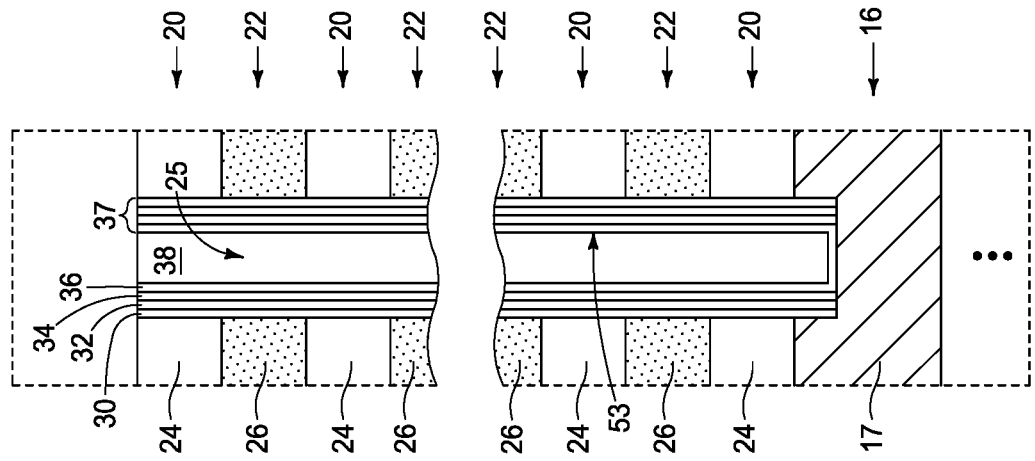
Figure 4A:
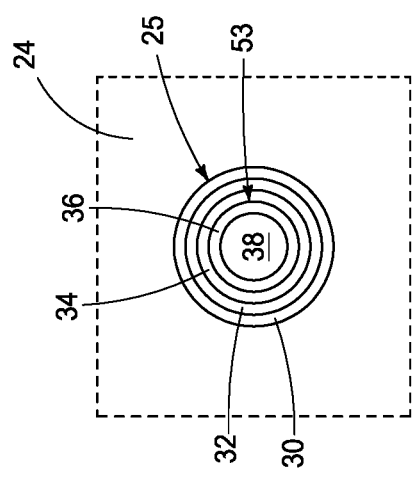
Figure 5:
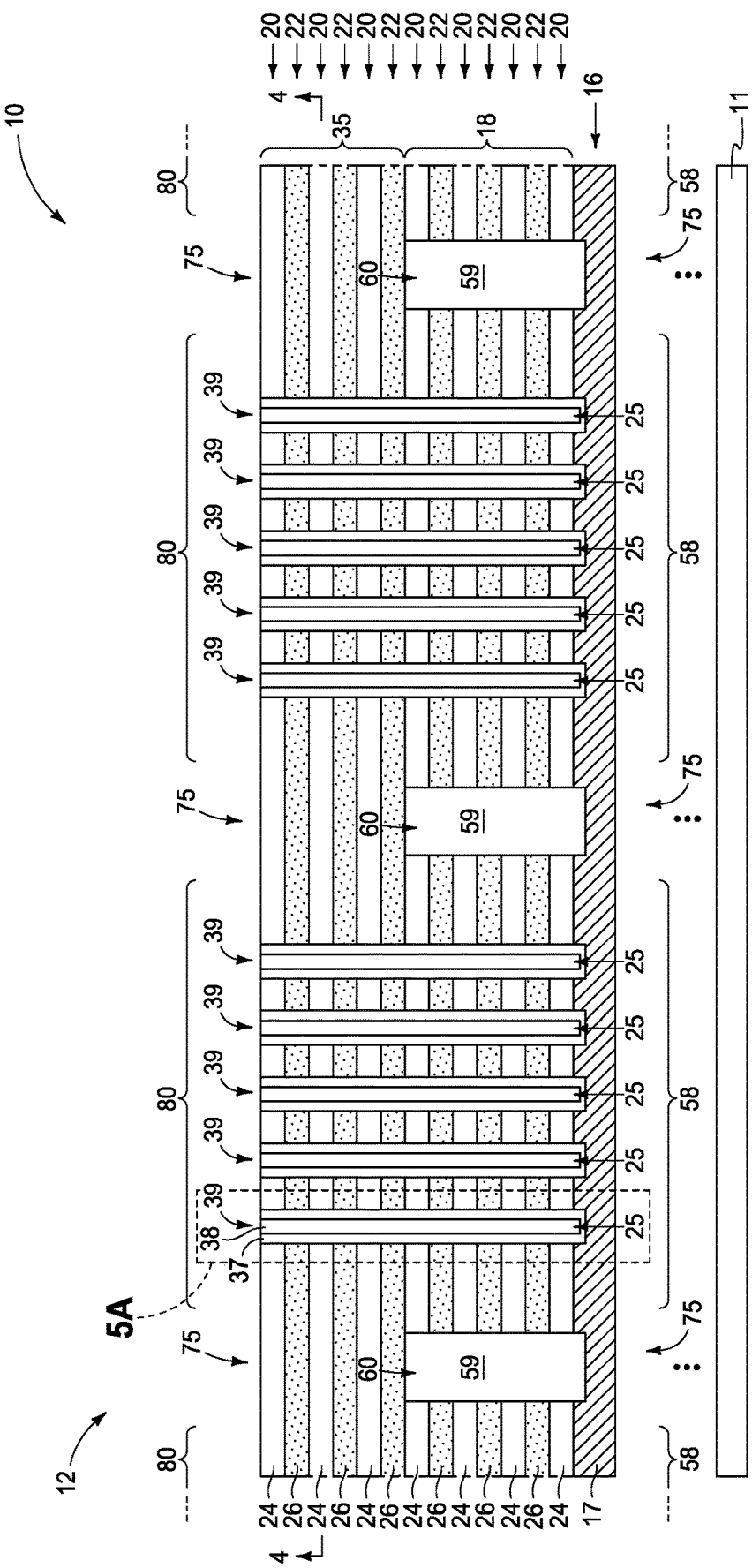

Some aspects of the invention were motivated in overcoming problems associated with so-called "block-bending" (a block stack tipping/tilting sideways relative to its longitudinal orientation during fabrication), although the invention is not so limited.

Embodiments of the invention encompass methods used in forming a memory array, for example an array of NAND or other memory cells having peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. First example method embodiments are described with reference to FIGS. 1-20 which may be considered as a "gate-last" or "replacement-gate" process.

FIGS. 1 and 2 show a construction 10 having an array or array area 12 in which elevationally-extending strings of transistors and/or memory cells will be formed. Construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1 and 2—depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductive material 17 has been formed above substrate 11. Conductor tier 16 may comprise part of control circuitry (e.g., peripheral-under-array circuitry and/or a common source line or plate) used to control read and write access to the transistors and/or memory cells that will be formed within array 12. A lower stack 18 comprising vertically-alternating lower insulative tiers 20 and lower conductive tiers 22 has been formed above conductor tier 16. Example thickness for each of tiers 20 and 22 is 22 to 60 nanometers. Only a small number of tiers 20 and 22 is shown, with more likely lower stack 18 comprising dozens, a hundred or more, etc. of tiers 20 and 22. Other circuitry that may or may not be part of peripheral and/or control circuitry may be between conductor tier 16 and lower stack 18. For example, multiple vertically-alternating tiers of conductive material and insulative material of such circuitry may be below a lowest of the lower conductive tiers 22 and/or above an uppermost of the lower conductive tiers 22. For example, one or more select gate tiers (not shown) may be between conductor tier 16 and the lowest conductive tier 22 and one or more select gate tiers may be above an uppermost of lower conductive tiers 22. Regardless, lower conductive tiers 22 may not comprise conducting material and lower insulative tiers 20 may not comprise insulative material or be insulative at this point in processing in conjunction with the hereby initially-described example method embodiment which is "gate-last" or "replacement-gate". Example lower conductive tiers 22 comprise first material 26 (e.g., silicon nitride) which may be wholly or partially sacrificial and in some embodiments that may be considered as placeholder material. Example lower insulative tiers 20 comprise second material 24 (e.g., silicon dioxide) that is of different composition from that of first material 26 and which may be wholly or partially sacrificial.

In one embodiment, lower channel openings 25 have been formed (e.g., by etching) through lower insulative tiers 20 and lower conductive tiers 22 to conductor tier 16. In some embodiments, lower channel openings 25 may go partially into conductive material 17 of conductor tier 16 as shown or may stop there-atop (not shown). Alternately, as an example, lower channel openings 25 may stop atop or within the lowest lower insulative tier 20. A reason for extending lower channel openings 25 at least to conductive material 17 of conductor tier 16 is to assure direct electrical coupling of subsequently-formed channel material (not yet shown) to conductor tier 16 without using alternative processing and structure to do so when such a connection is desired.

Etch-stop material (not shown) may be within or atop conductive material 17 of conductor tier 16 to facilitate stopping of the etching of lower channel openings 25 relative to conductor tier 16 when such is desired. Such etch-stop material may be sacrificial or non-sacrificial. By way of example and for brevity only, lower channel openings 25 are shown as being arranged in groups or columns of staggered rows of four and five openings 25 per row and being arrayed in lower-laterally-spaced memory-block regions 58 (having space 75 there-between) that will comprise laterally-spaced memory blocks 58 in a finished circuitry construction. Lower-memory-block regions 58 and the resultant memory blocks (not yet shown) may be considered as being longitudinally elongated and oriented, for example along a direction 55. Lower-memory-block regions 58 may otherwise not be discernable at this point of processing. Any alternate existing or future-developed arrangement and construction may be used.

In one embodiment, lower-elevationally-extending holes 60 have been formed in lower stack 18 and are laterally-between and longitudinally-spaced-along immediately-laterally-adjacent lower-memory-block regions 58. Lower holes 60 when so-formed may have respective bottoms that are directly against conductive material 17 (e.g., atop or within) of conductor tier 16 (as shown) or may have respective bottoms that are above conductive material 17 of conductor tier 16 (not shown). Lower holes 60 when so-formed may be formed commensurately with formation of lower channel openings 25 if lower channel openings are so-formed. Alternately, such may be formed before or after forming lower channel openings 25 if lower channel openings are so-formed. Accordingly, and regardless, lower holes 60 when so-formed are laterally-between and longitudinally-spaced-along immediately-laterally-adjacent lower-memory-block regions 58 regardless of formation of lower channel openings 25 at this point of processing. In one embodiment, lower holes 60 are formed to be vertical or within 10° of vertical. In one embodiment, lower holes 60 are formed to be everywhere larger in horizontal cross-section than lower channel openings 25.

Referring to FIG. 3, sacrificial material 59 has been formed in lower holes 60 when present and in lower channel openings 25 when present. Sacrificial material 59 is ideally of a composition that can be etched highly selectively (e.g., at a volumetric etch rate/ratio of 10:1 or greater) relative to materials 24 and 26. Being sacrificial, such may comprise any one or more of insulative, semiconductive, or conductive, with doped or undoped oxides being examples. Thereafter, and as shown, an upper stack 35 comprising vertically-alternating upper insulative tiers 20 and upper conductive tiers 22 has been formed above lower stack 18 and sacrificial material 59. Upper stack 35 may be considered as comprising upper-laterally-spaced memory-block regions 80 (having space 75 there-between) that are directly above lower-memory-block regions 58. Upper-memory-block regions 80 may be indistinguishable at this point in the processing and may not be, depending on finished construction, perfectly laterally-aligned relative lower-memory-block regions 58 (perfect lateral alignment being shown) such that all of upper-memory-block regions 80 are not totally directly above lower-memory-block-regions 58 (e.g., there being a part of regions 80 that extend laterally-beyond edges of regions 58, and not shown). Regardless, upper stack 35 may have any of the attributes described above with respect to lower stack 18. FIG. 3, in one embodiment, shows upper channel openings 39 formed in upper stack 35 to individual lower channel openings 25.

Transistor channel material may be formed in the individual upper and lower channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

FIGS. 4, 4A, 5, and 5A show one embodiment wherein sacrificial material 59 has been removed from interconnected upper and lower channel openings 39 and 25, respectively. Thereafter, charge-blocking material 30, storage material 32, and charge-passage material 34 have been formed in channel openings 39/25 elevationally along insulative tiers 20 and conductive tiers 22. Transistor materials 30, 32, and 34 (e.g., memory cell materials) may be formed by, for example, deposition of respective thin layers thereof over stack 18 and within individual channel openings 39/25 followed by planarizing such back at least to a top surface of stack 18. Channel material 36 has also been formed in channel openings 39/25 elevationally along insulative tiers 20 and conductive tiers 22, thus comprising individual operative channel-material strings 53. Materials 30, 32, 34, and 36 are collectively shown as and only designated as material 37 in FIGS. 4 and 5 due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of lower channel openings 25 to expose conductor tier 16 such that channel material 36 is directly against conductive material 17 of conductor tier 16. Such punch etching may occur separately with respect to each of materials 30, 32, and 34 (as shown) or may occur collectively with respect to all after deposition of material 34 (not shown). Alternately, and by way of example only, no punch etching may be conducted and channel material 36 may be directly electrically coupled to conductive material 17 of conductor tier 16 by a separate conductive interconnect (not shown). Channel openings 39/25 are shown as comprising a radially-central solid dielectric material 38 (e.g., spin-on-dielectric, silicon dioxide, and/or silicon nitride). Alternately, and by way of example only, the radially-central portion within channel openings 39/25 may include void space(s) (not shown) and/or be devoid of solid material (not shown). Further and regardless, materials 30, 32, 34, 36, and 38 may be formed in lower channel openings 25 in lieu of sacrificial material 59 prior to forming upper stack 35 (not shown). Conductive plugs (not shown) may be formed atop channel-material strings 53 for better conductive connection to overlying circuitry (not shown).

Figure 6:
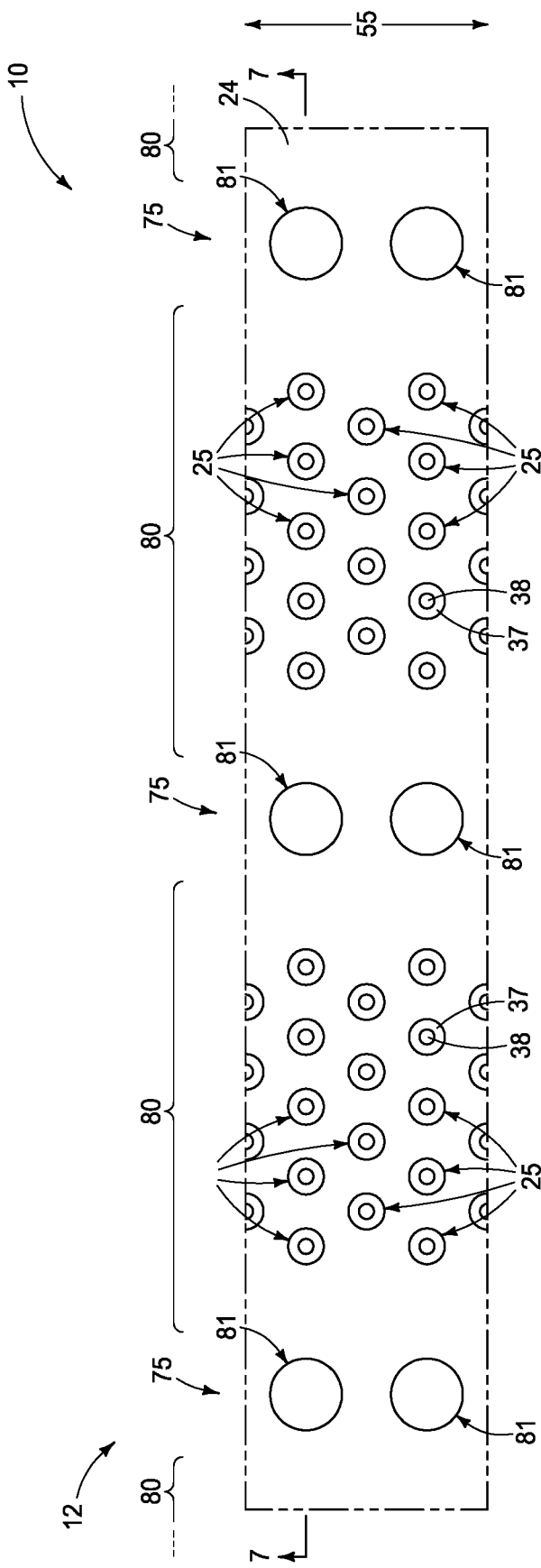
Figure 7:
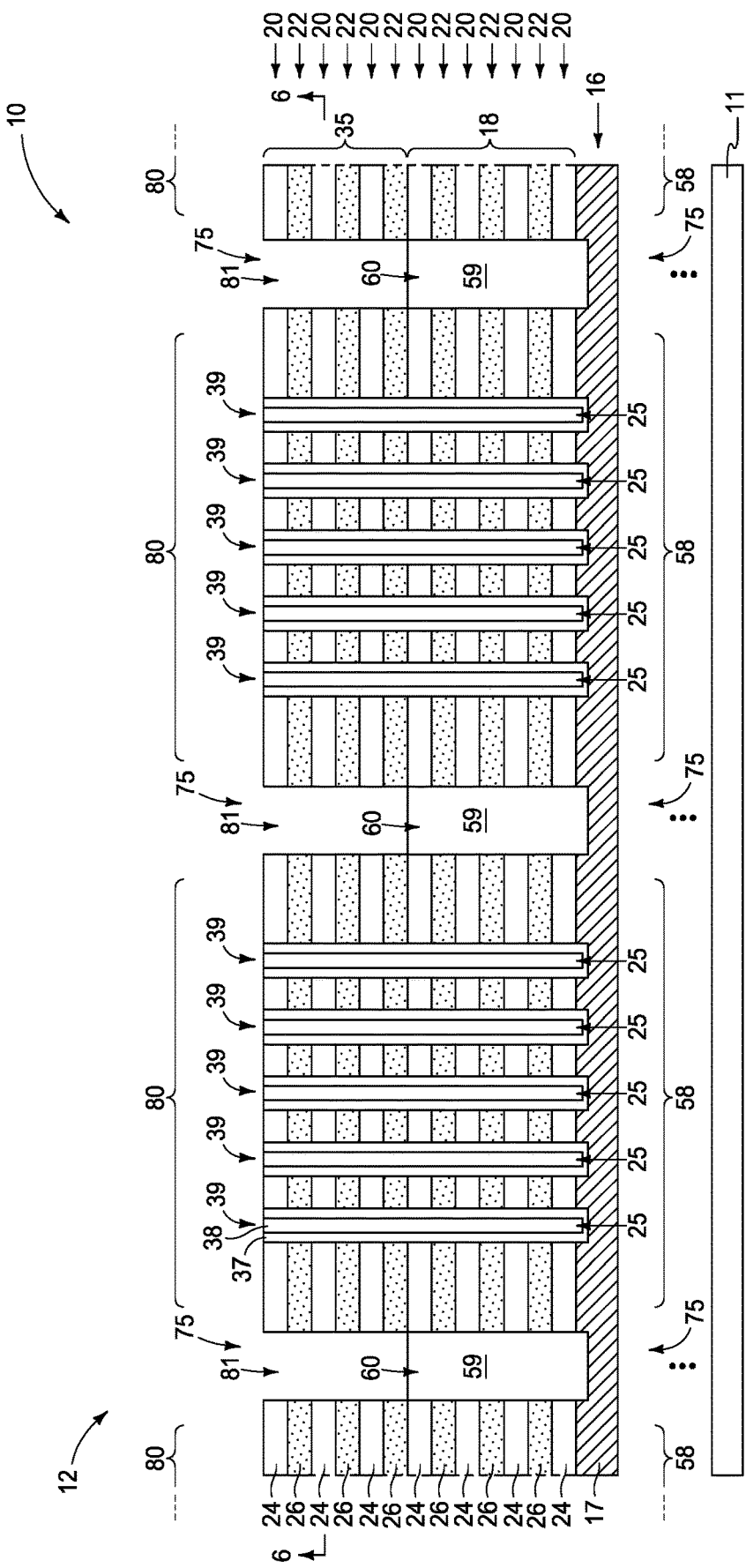

Referring to FIGS. 6 and 7, upper-elevationally-extending holes 81 have been formed in upper stack 35 and are laterally-between and longitudinally spaced-along immediately-laterally-adjacent upper-memory-block regions 80. Upper holes 81 are atop and expose sacrificial material 59 in lower holes 60. Perfect alignment need not occur (perfect alignment being shown). Insulative material (e.g., 24) of lower insulative tiers 20 and upper insulative tiers 20 extends around the respective upper and lower holes 81, 60 and laterally across space 75 that is laterally-between immediately-laterally-adjacent lower-memory-block-regions 58 and immediately-laterally-adjacent upper-memory-block regions 80. In one embodiment, upper holes 81 are formed to be everywhere larger in horizontal cross-section than upper channel openings 39.

Figure 8:
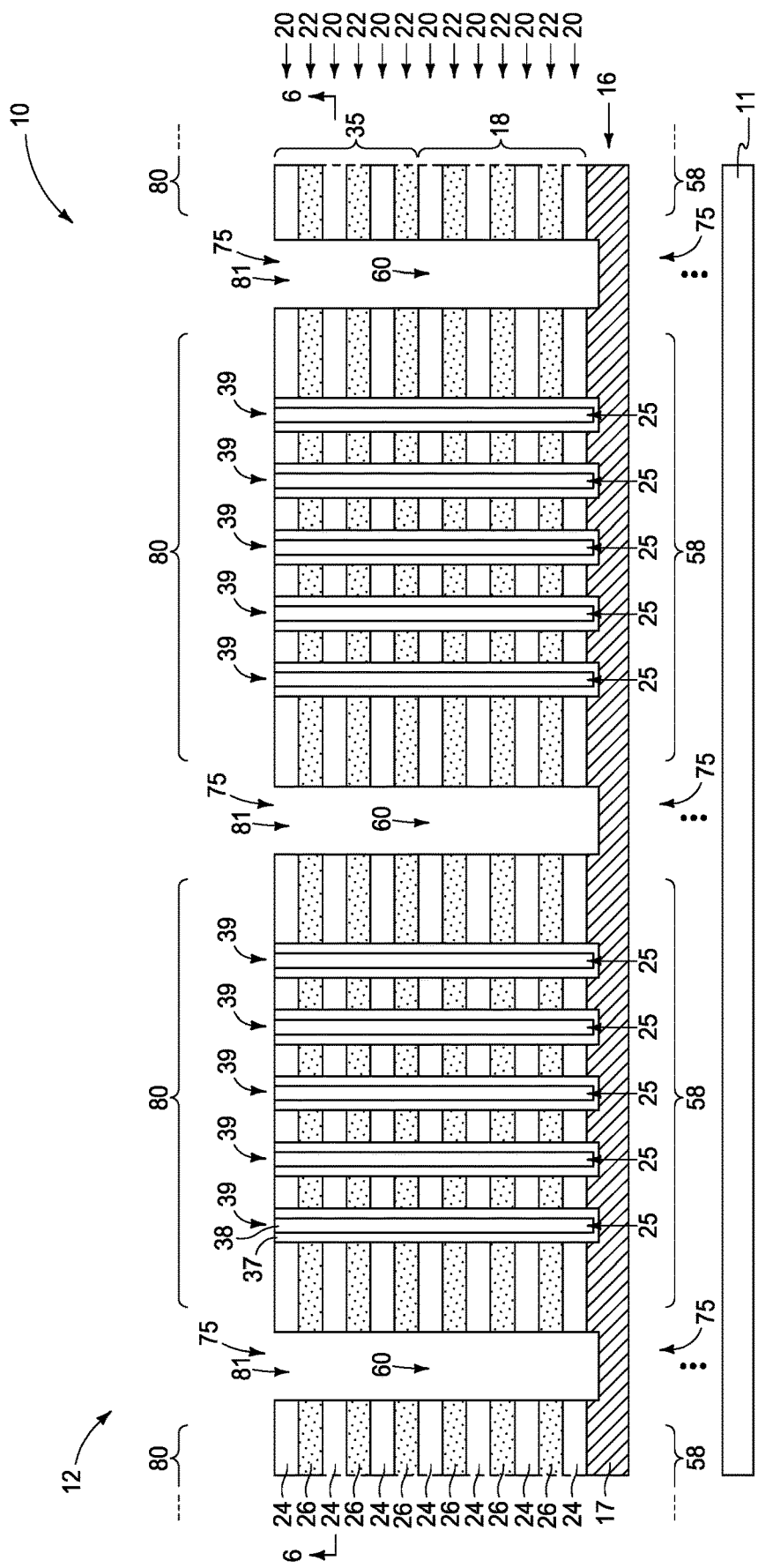

Referring to FIG. 8, sacrificial material 59 (not shown) has been removed (e.g., by anisotropic and/or isotropic etching) from lower holes 60 through upper holes 81.

Figure 9:
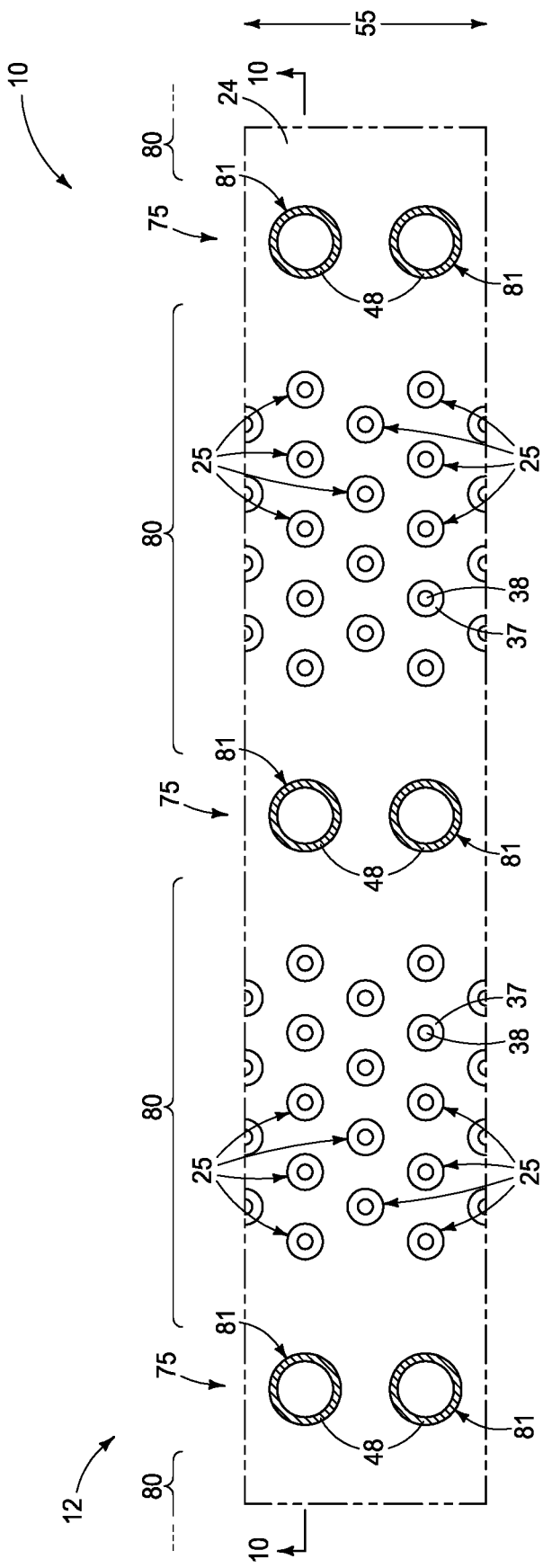
Figure 10:
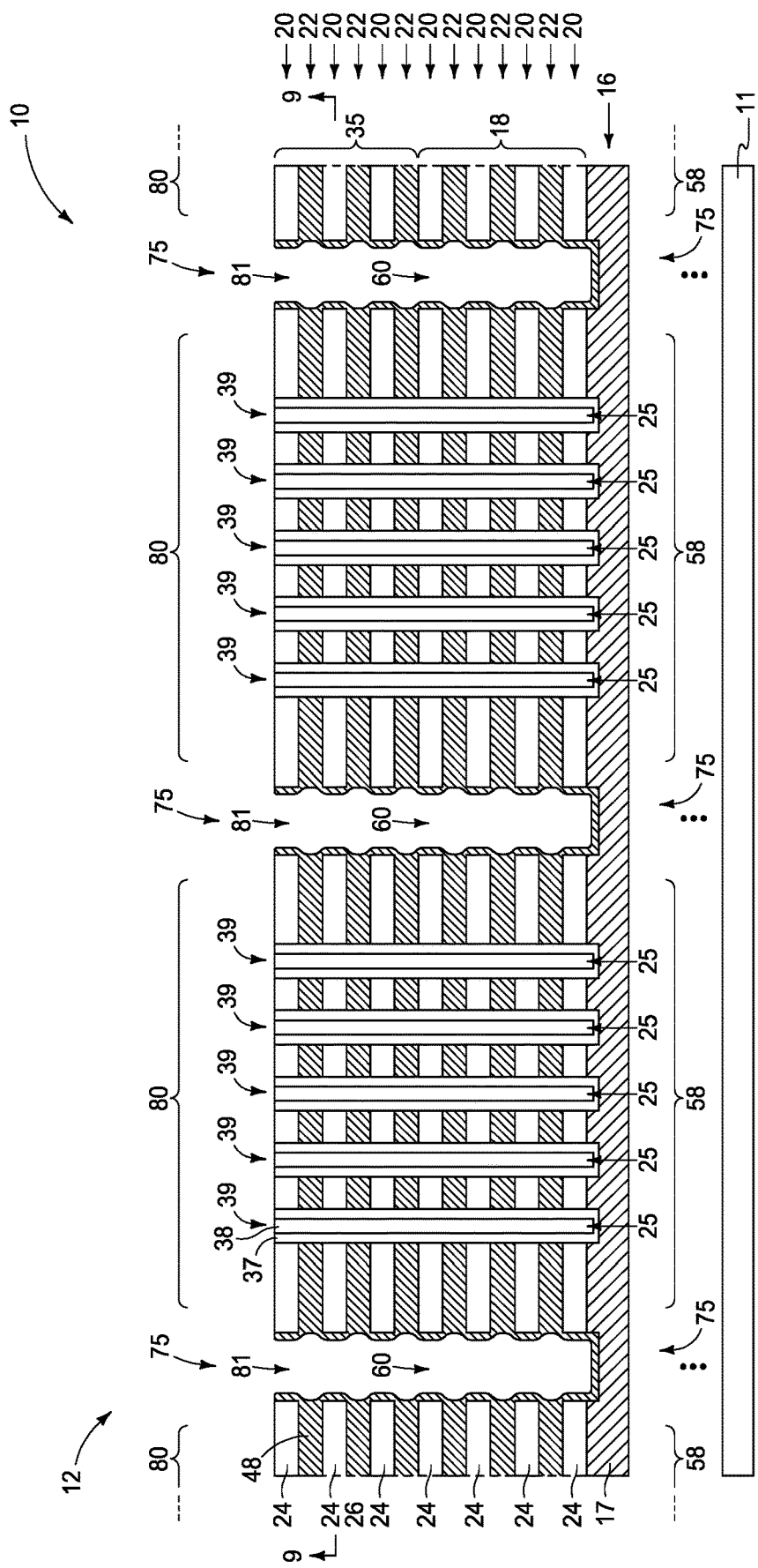
Figure 11:
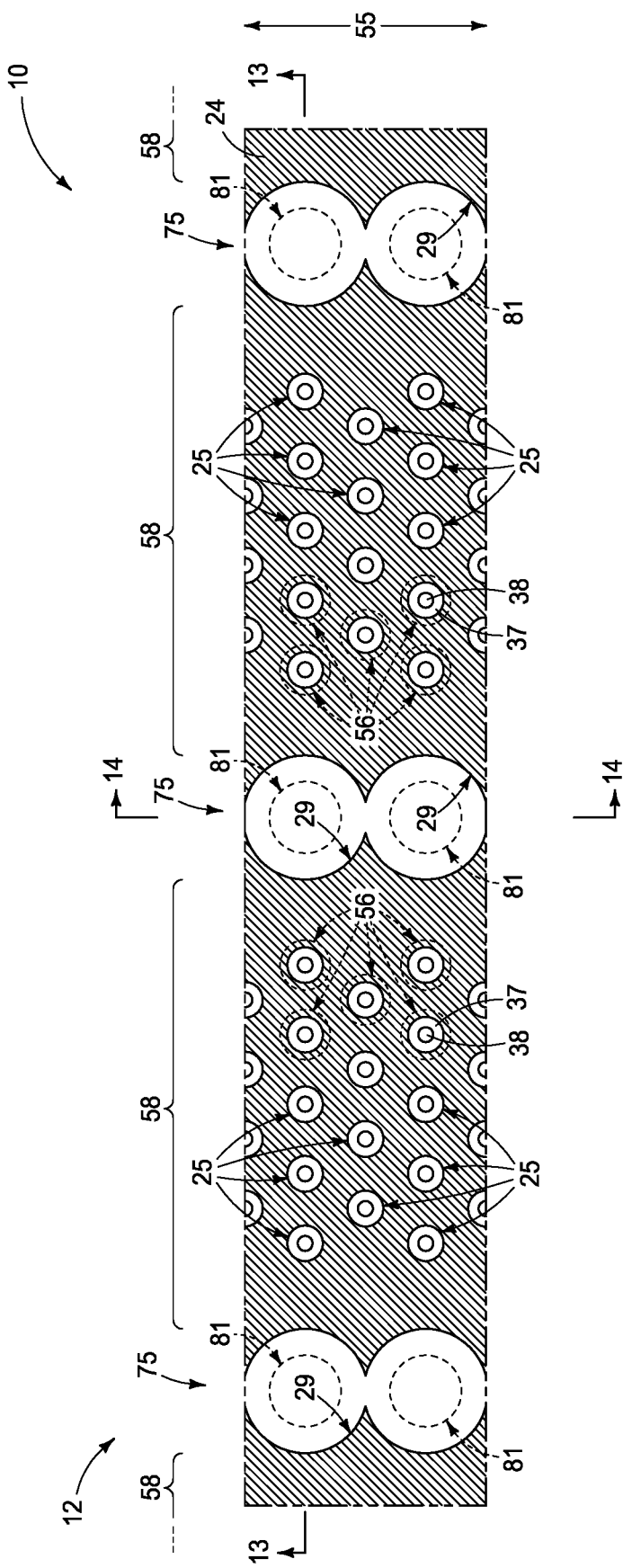
Figure 12:
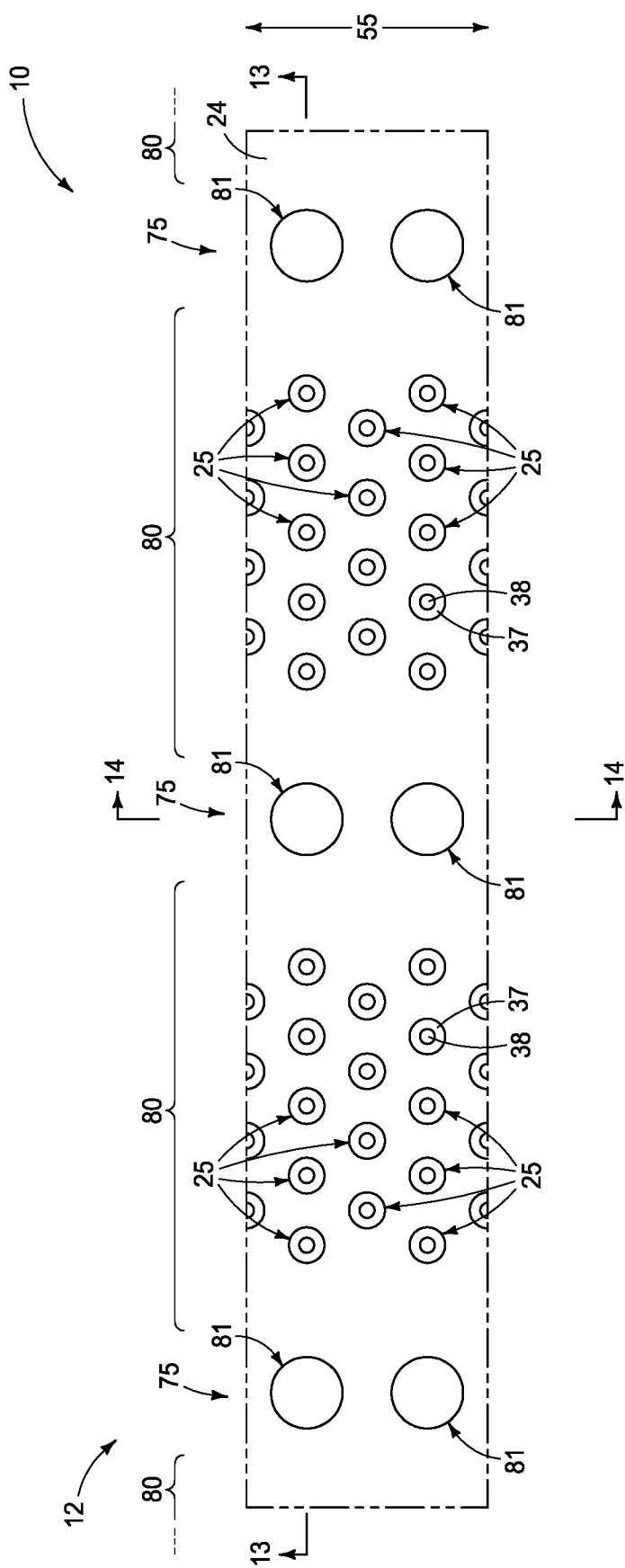
Figure 13:
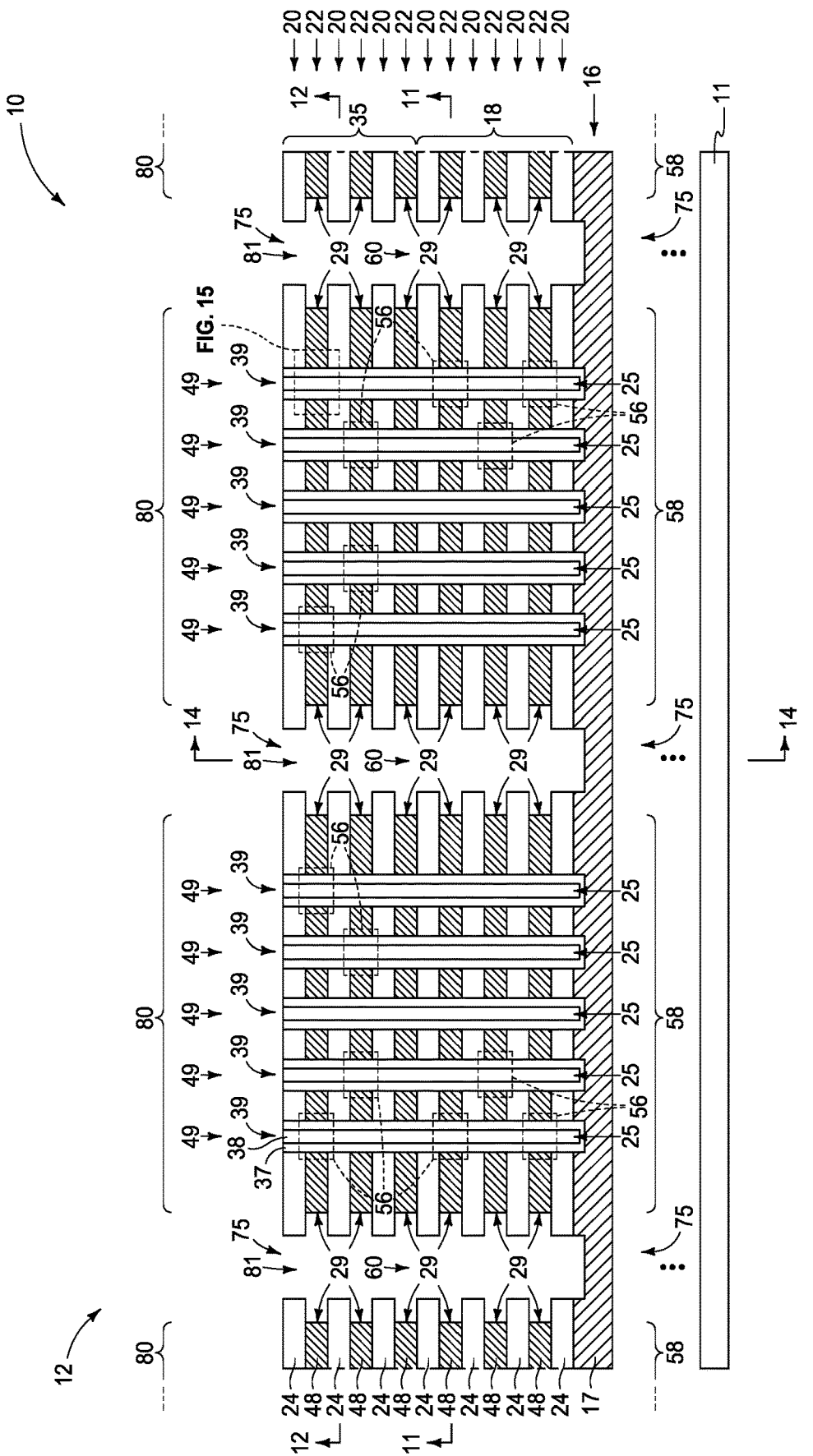
Figure 15:
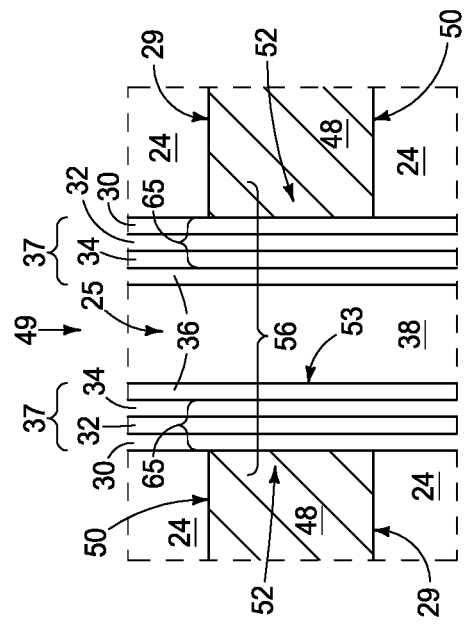
Figure 14:
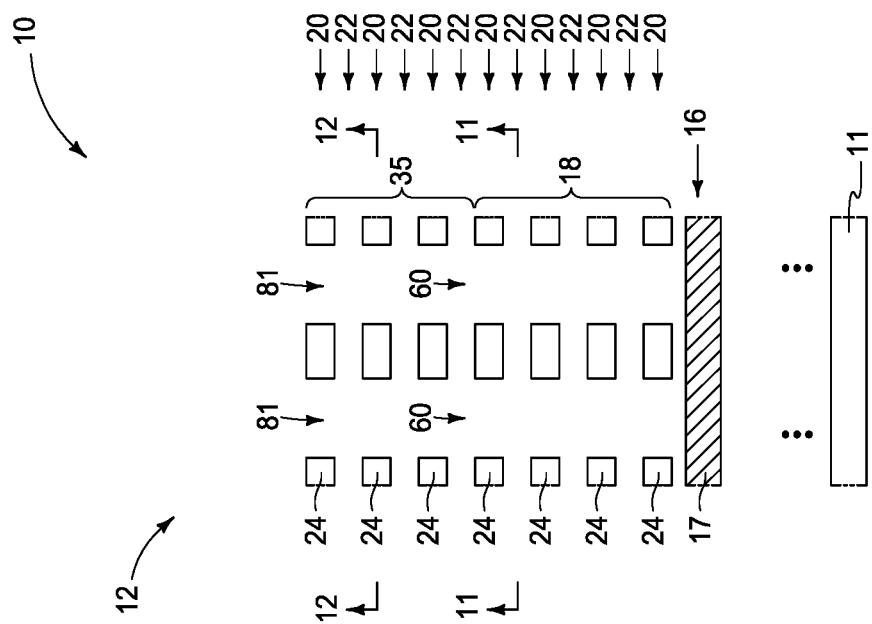
Figure 16:
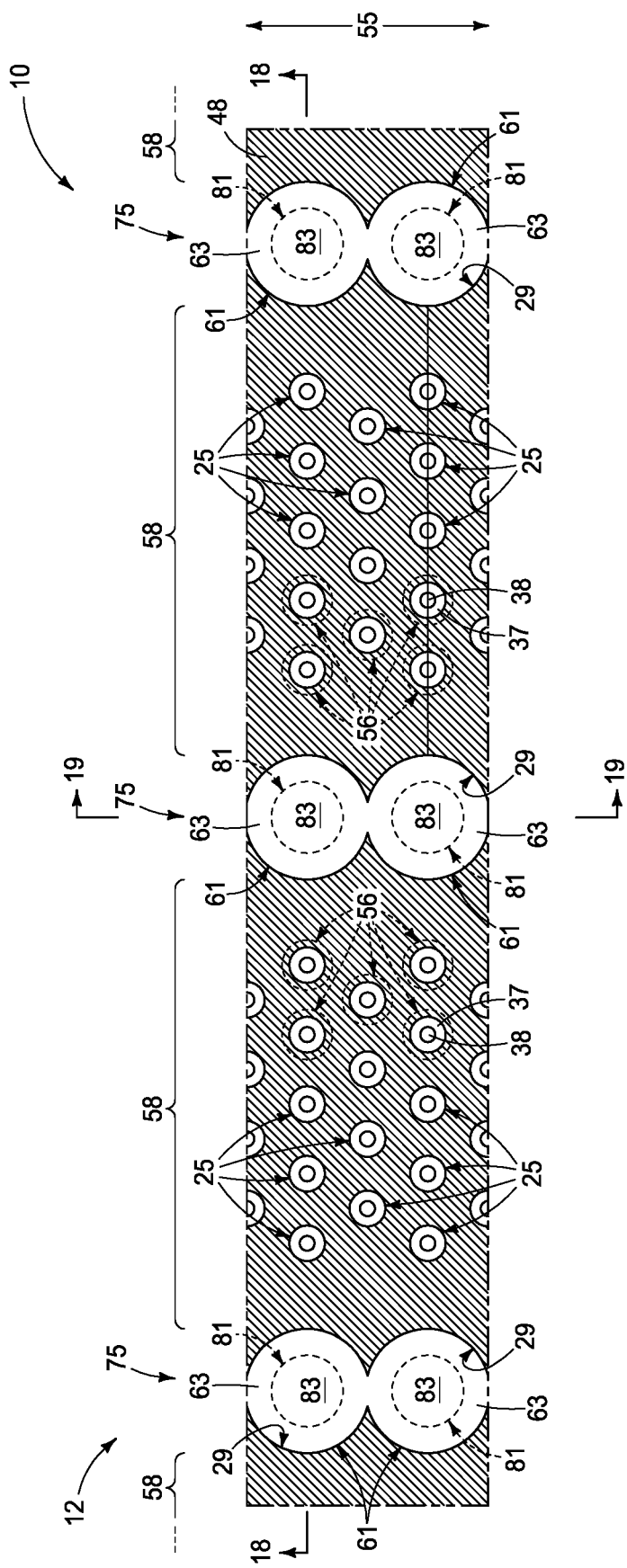
Figure 17:
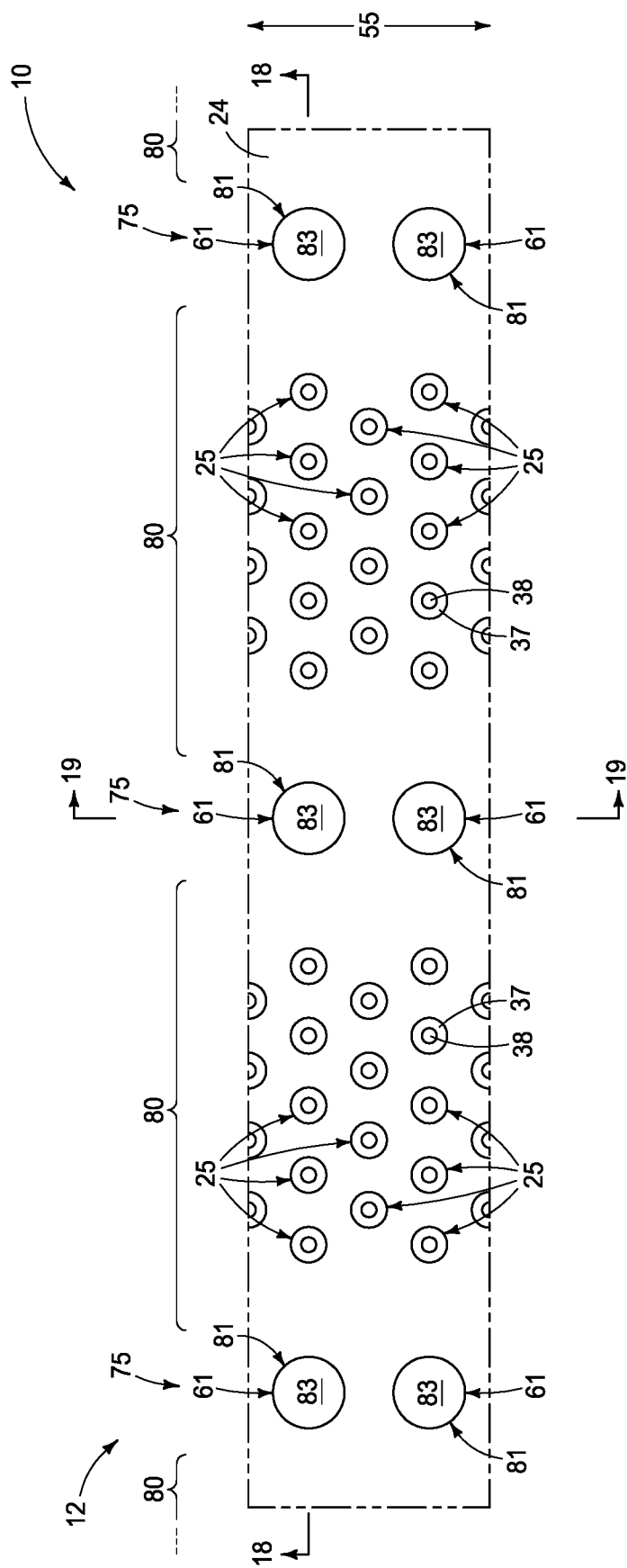
Figure 18:
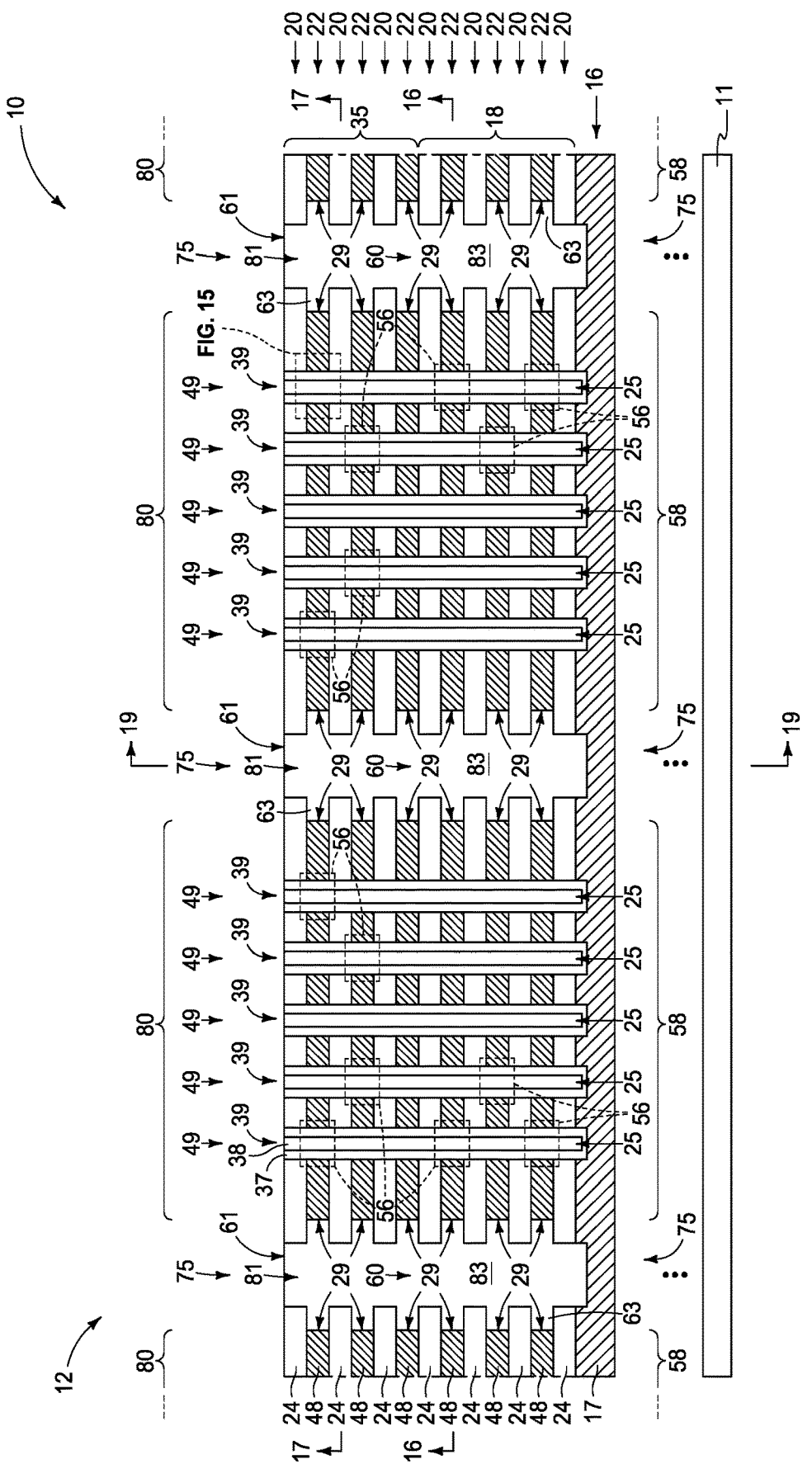
Figure 20:
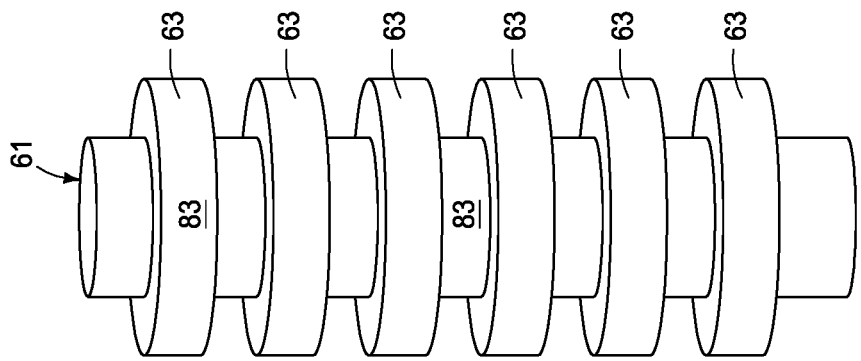
Figure 19:
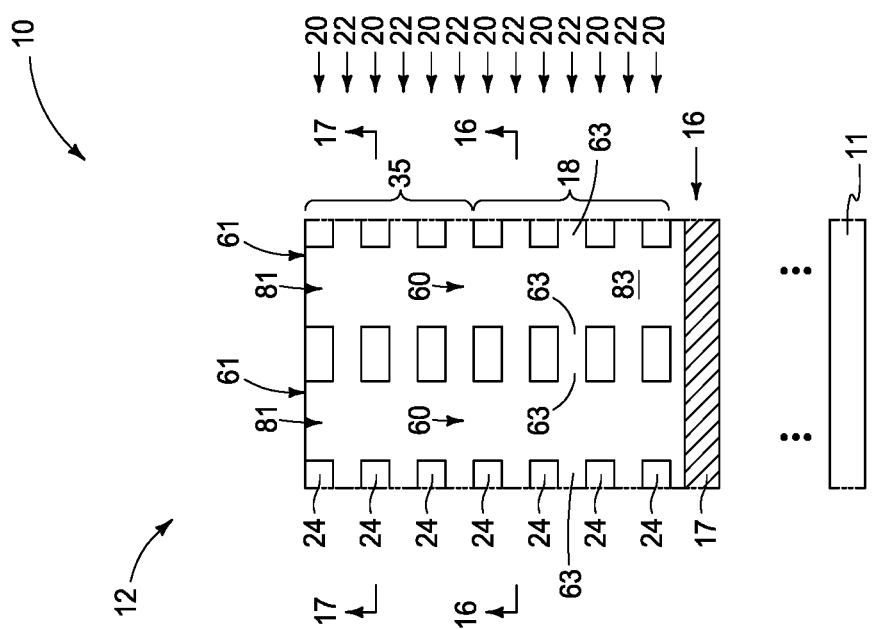

Referring to FIGS. 9 and 10, and in one embodiment, material 26 (not shown) of conductive tiers 22 has been removed, for example by being isotropically etched away through upper holes 81 and lower holes 60, ideally selectively relative to the other exposed materials (e.g., using liquid or vapor $H_3PO_4$ as a primary etchant where material 26 is silicon nitride, and other materials comprise one or more oxides or polysilicon). Material 26 in upper and lower conductive tiers 22 in the example embodiment is sacrificial (e.g., is placeholder material) and has been replaced with conducting material 48. A thin insulative liner (e.g., $Al_2O_3$ and not shown) may be formed before forming conducting material 48. Conducting material 48 may be deposited in such a manner whereby it does not completely fill interconnected upper and lower holes 81/60 and might remain vertically interconnecting conducting material 48 in conductive tiers 22 at this point of processing, for example as shown.

Referring to FIGS. 11-15, example subsequent processing has occurred wherein conducting material 48 has been removed from interconnected holes 81/60 such that conductive tiers 22 are no longer interconnected by conducting material 48. Such processing may comprise isotropic wet etching of conducting material 48 whereby interconnected holes 81/60 effectively radially expand in conductive tiers 22. Such is ideally conducted selectively relative to material 24 (and material 17) whereby little if any radial expansion occurs of interconnected holes 81/60 in insulative tiers 20. Such may result in conducting material 48 being laterally-recessed relative to the initially-formed upper and lower holes 81/60, as shown. Such processing has resulted in the forming of individual conductive lines 29 (e.g., wordlines) and elevationally-extending strings 49 of individual transistors and/or memory cells 56. Approximate locations of transistors and/or memory cells 56 are indicated with a bracket in FIG. 15 and some with dashed outlines in FIGS. 11 and 13, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 (FIG. 15) corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

In one embodiment and as shown with respect to the example "gate-last" processing, conducting material 48 of upper and lower conductive tiers 22 is formed after removing sacrificial material 59 from interconnected holes 81/60. In an alternate embodiment, for example using gate-first processing, conducting material 48 of the upper and lower conductive tiers is formed before forming the upper and lower holes 81, 60, respectively, and not shown.

Referring to FIGS. 16-20, and after sacrificial material 59 has been removed, and in one embodiment, upper and lower holes 81/60 have been filled (i.e., at least predominately [greater than 50% up to and including 100%]) with insulator material 83. In one embodiment and as shown, such has resulted in the forming of insulative pillars 61 laterally-between and longitudinally-along immediately-laterally-adjacent memory blocks. In one such embodiment and as shown, pillars 61 comprise vertically-spaced and radially-projecting insulative rings 63 in conductive tiers 22 as compared to the insulative tiers 20. In one embodiment, insulator material 83 is of a composition at least predominantly the same as insulative material 24 of insulative tiers 20, and in another embodiment is of a composition that is at least predominantly different there-from. In an alternate embodiment, upper and lower holes 81/60 holes may remain essentially as void-space in a finished construction (not shown).

Figure 21:
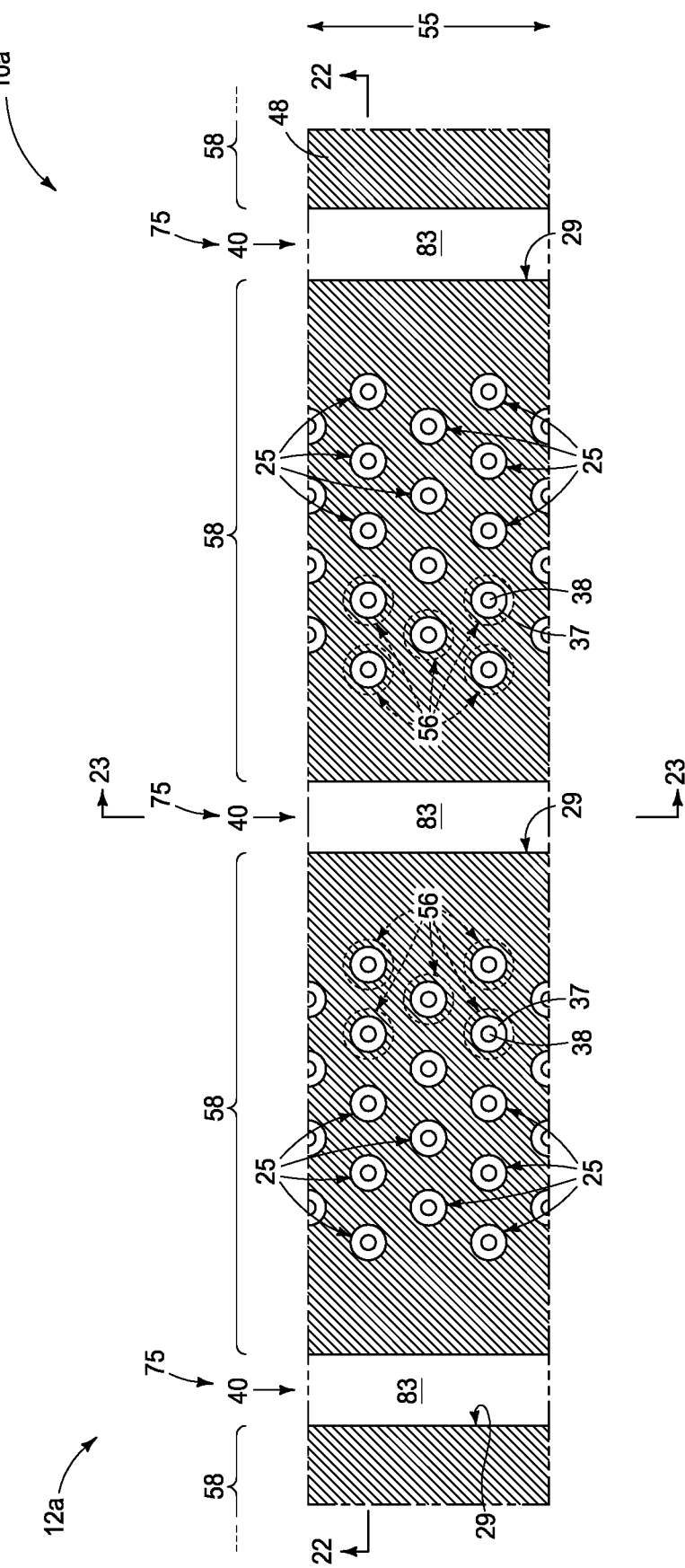
FIGS. 21-23 are diagrammatic cross-sectional views of a portion of a substrate in accordance with an embodiment of the invention.
Figure 22:
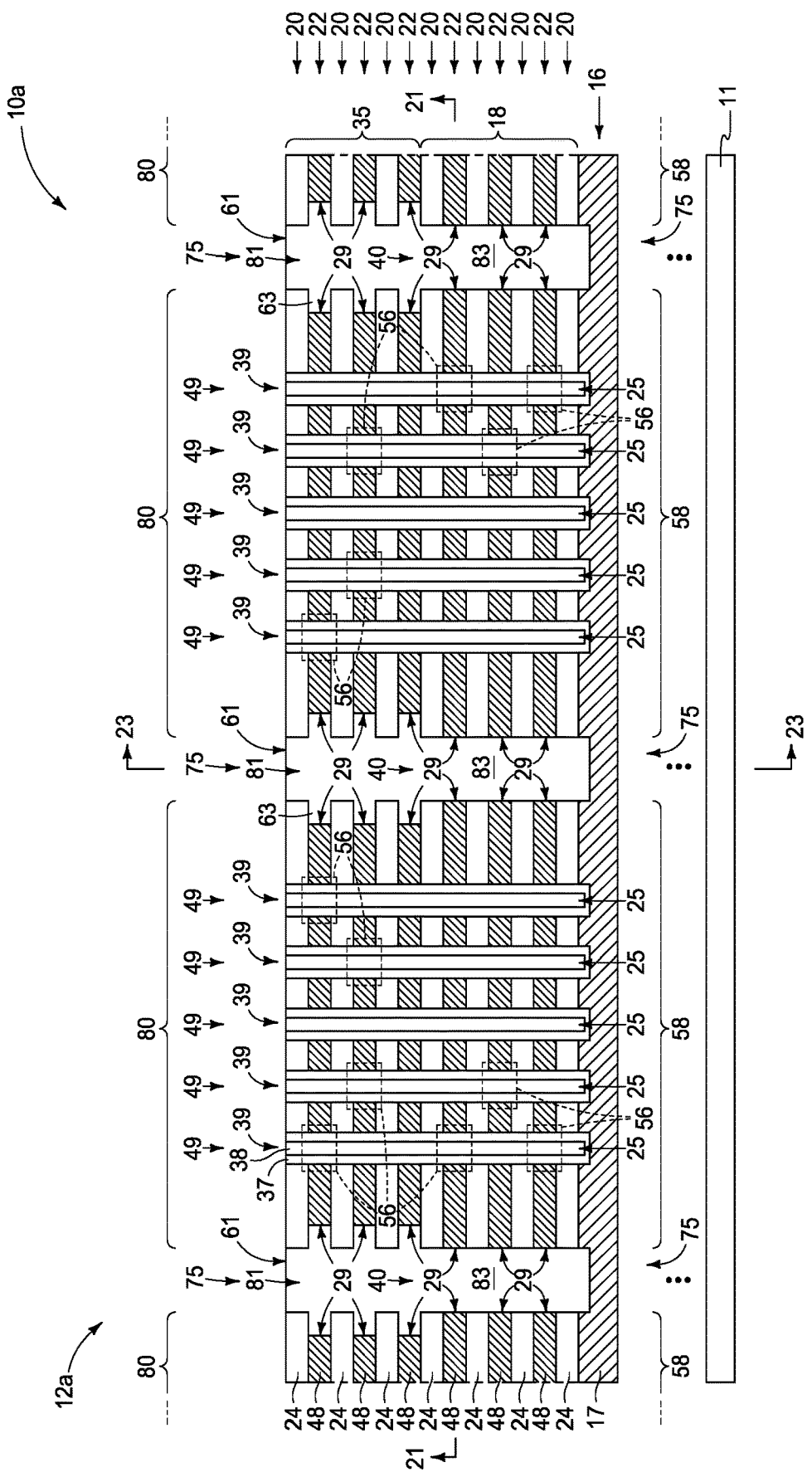
Figure 23:
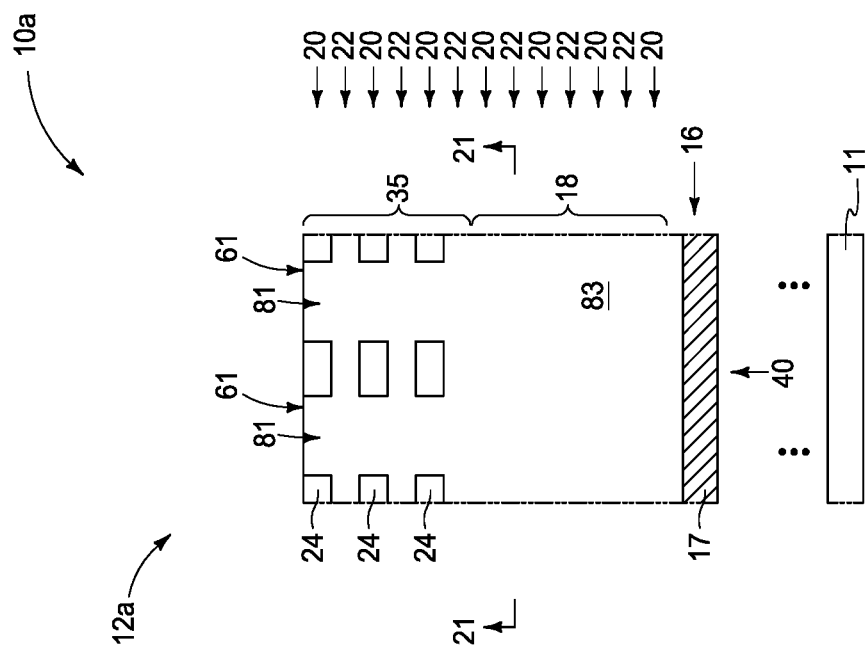
Figure 24:
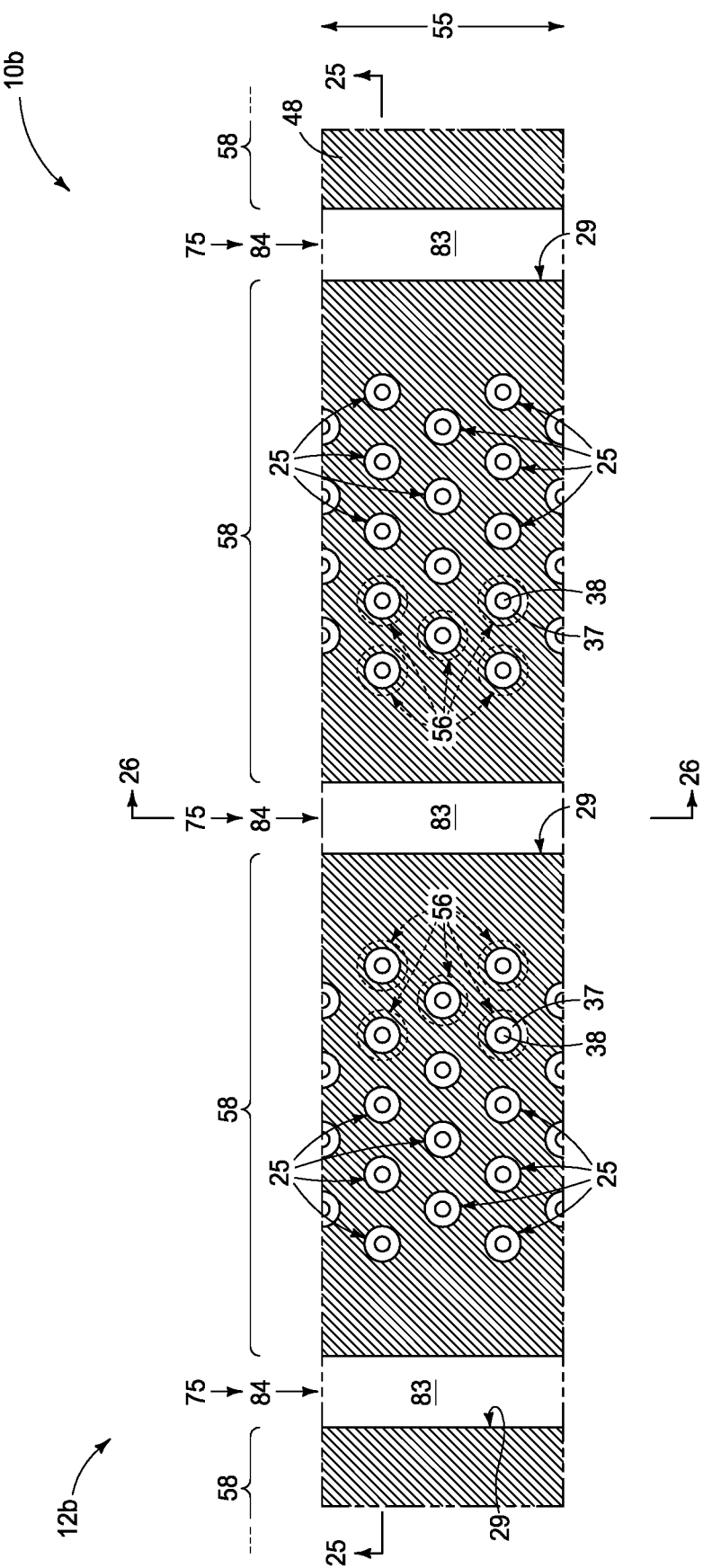
FIGS. 24-26 are diagrammatic cross-sectional views of a portion of a substrate in accordance with an embodiment of the invention.
Figure 25:
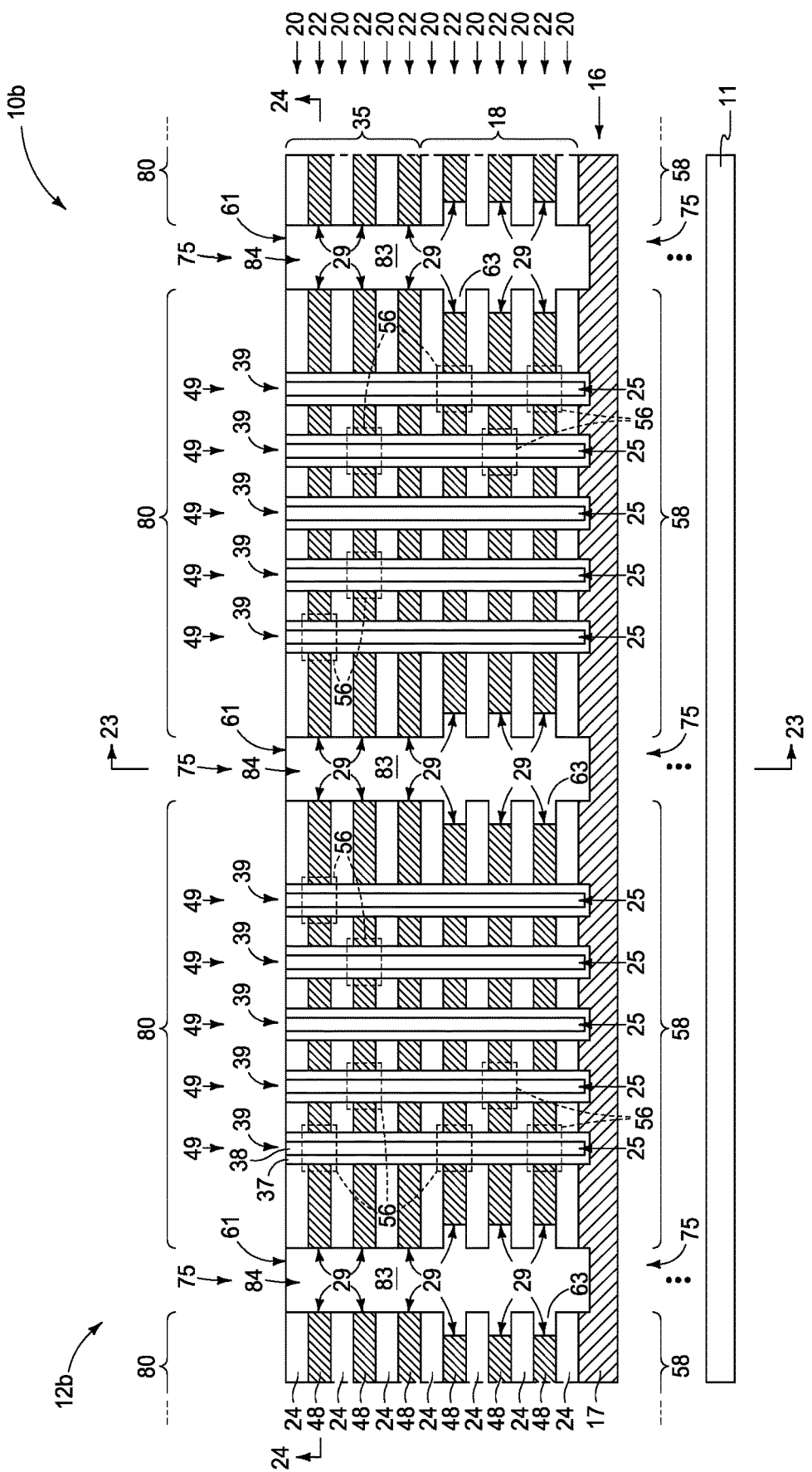
Figure 26:
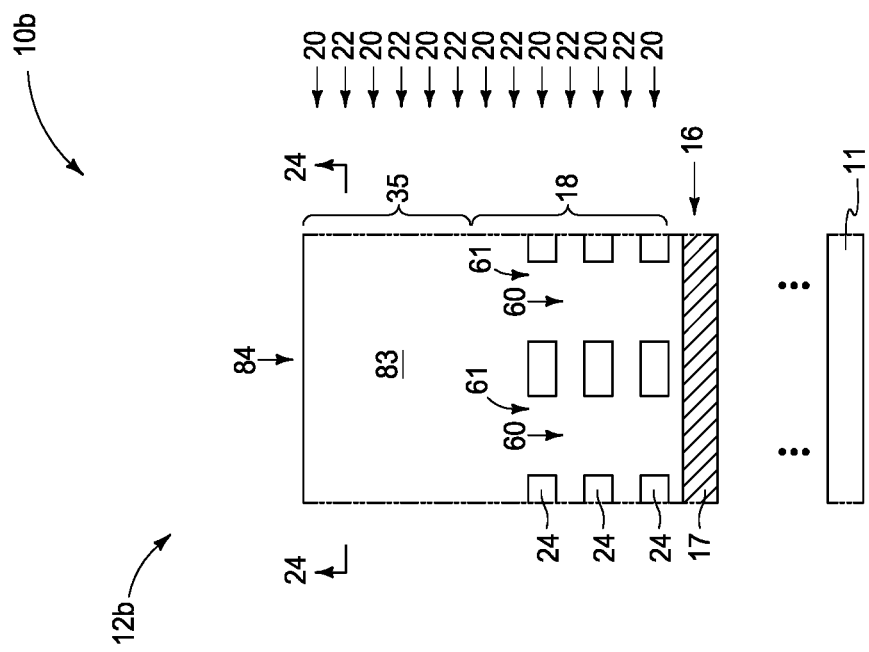

The above described example method embodiments formed both lower holes 60 and upper holes 81 laterally-between and longitudinally-spaced-along the respective immediately-laterally-adjacent memory-block regions. Alternately, and by way of example only, horizontally-elongated trenches may be formed in the respective upper or lower stacks instead of holes. FIGS. 21-23 show an example alternate embodiment construction 10a wherein lower-horizontally-elongated trenches 40 have been formed in lower stack 18 in lieu of lower holes 60. Like numerals from the above-described embodiments have been used where appropriate, with some construction differences being indicated with the suffix "a" or with different numerals. Trenches 40 may have respective bottoms that are directly against conductive material 17 (e.g., atop or within) of conductor tier 16 (as shown) or may have respective bottoms that are above conductive material 17 of conductor tier 16 (not shown). FIGS. 24-26 show another alternate embodiment construction 10b wherein lower holes 60 are in lower stack 18 and upper-horizontally-elongated trenches 84 are in upper stack 35. Like numerals from the above-described embodiments have been used where appropriate, with some construction differences being indicated with the suffix "b" or with different numerals. Any other attribute(s) or aspect(s) as shown and/or described herein with respect to other embodiments may be used.

Accordingly, and in one embodiment, a method used in forming a memory array (e.g., 12a, 12b) comprising strings (e.g., 49) of memory cells (e.g., 56) comprises forming a lower stack (e.g., 18) comprising vertically-alternating lower insulative tiers (e.g., 20) and lower conductive tiers (e.g., 22), with the lower stack comprising lower-laterally-spaced memory-block regions (e.g., 58). One of (a) and (b) is formed, where: (a) is lower-horizontally-elongated trenches (e.g., 40) in the lower stack that individually are laterally-between immediately-laterally-adjacent of the lower-memory-block regions, and (b) is lower-elevationally-extending holes (e.g., 60) in the lower stack that are laterally-between and longitudinally-spaced-along the immediately-laterally-adjacent lower-memory-block regions. Sacrificial material (e.g., 59) is formed in the one of said (a) and said (b). An upper stack (e.g., 35) is formed that comprises vertically-alternating upper insulative tiers (e.g., 20) and upper conductive tiers (e.g., 22) above the lower stack and the sacrificial material. The upper stack comprises upper-laterally-spaced memory-block regions (e.g., 80) that are directly above the lower-laterally-spaced memory-block regions. One of (c) and (d) is formed, where: (c) is upper-horizontally-elongated trenches (e.g., 84) in the upper stack that are individually laterally-between immediately-laterally-adjacent of the upper-memory-block regions if said (b), with the upper trenches if said (b) being atop and exposing the sacrificial material in said (b), and (d) is upper-elevationally-extending holes (e.g., 81) in the upper stack that are laterally-between and longitudinally-spaced-along the immediately-laterally-adjacent upper-memory-block regions, with the upper holes being atop and exposing the sacrificial material in the one of said (a) and (b). This method embodiment comprises at least one of said (b) and (d), with insulative material (e.g., 24) of the respective lower insulative tiers or the upper insulative tiers extending around at least one of said (b) and (d) and laterally across space (e.g., 75) that is laterally-between the immediately-laterally-adjacent lower-memory-block regions or the immediately-laterally-adjacent upper-memory-block regions. The sacrificial material is removed from the one of said (a) and (b) through the one of said (c) and (d). Any other attribute(s) or aspect(s) as shown and/or described herein with respect to other embodiments may be used.

Embodiments of the invention encompass memory arrays independent of method of manufacture. Nevertheless, such memory arrays may have any of the attributes as described herein in method embodiments. Likewise, the above-described method embodiments may incorporate and form any of the attributes described with respect to device embodiments.

Embodiments of the invention include a memory array (e.g., 12, 12a, 12b) comprising strings of memory cells (e.g., 49). Such embodiments comprise laterally-spaced memory blocks (e.g., 80/58) individually comprising a vertical stack (e.g., 18/35) comprising alternating insulative tiers (e.g., 20) and conductive tiers (e.g., 22). Operative channel-material strings (e.g., 53) of memory cells (e.g., 56) extend through the insulative tiers and the conductive tiers.

In one embodiment, insulative material (e.g., 24) of the insulative tiers extends laterally across space (e.g., 75) that is laterally-between immediately-laterally-adjacent of the memory blocks. The insulative material has elevationally-extending holes (e.g., 81, 60) that are laterally-between and longitudinally-along the immediately-laterally-adjacent memory blocks. In one embodiment, the holes (e.g., 81/60) extend through all of the alternating insulative and conductive tiers (e.g., construction 10). In another embodiment, the holes do not extend through all of the alternating insulative and conductive tiers (e.g., constructions 10a, 10b), with in one such embodiment the holes being in an uppermost portion of the alternating insulative and conductive tiers (e.g., FIGS. 21-23), and in another embodiment being in a lowermost portion of the alternating insulative and conductive tiers (e.g., FIGS. 24-26). In one embodiment, the holes are everywhere larger in horizontal cross-section than the channel-material strings. Any other attribute(s) or aspect(s) as shown and/or described herein with respect to other embodiments may be used.

In one embodiment, insulative pillars (e.g., 61) are laterally-between and longitudinally-along immediately-laterally-adjacent of the memory blocks. The pillars are circumferentially-surrounded by and directly against insulative material (e.g., 24) of the insulative tiers. Any other attribute(s) or aspect(s) as shown and/or described herein with respect to other embodiments may be used.

In one embodiment, insulative pillars (e.g., 61) are laterally-between and longitudinally-along immediately-laterally-adjacent of the memory blocks. The pillars comprise vertically-spaced and radially-projecting insulative rings (e.g., 63) in the conductive tiers as compared to the insulative tiers. In one embodiment, the rings are of a circular shape in a horizontal cross-section. In one embodiment, the rings are at least predominately of a composition the same as that of the insulative tiers, and in another embodiment are at least predominately of a composition that is different from that of the insulative tiers. Any other attribute(s) or aspect(s) as shown and/or described herein with respect to other embodiments may be used.

The above processing(s) or construction(s) may be considered as being relative to an array of components formed as or within two stacks or two decks of such components above or as part of an underlying base substrate (albeit, the two stacks/decks may each have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles.

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a memory array comprising strings of memory cells comprises laterally-spaced memory blocks individually comprising a vertical stack comprising alternating insulative tiers and conductive tiers. Operative channel-material strings of memory cells extend through the insulative tiers and the conductive tiers. Insulative material of the insulative tiers extends laterally across space that is laterally-between immediately-laterally-adjacent of the memory blocks. The insulative material has elevationally-extending holes that are laterally-between and longitudinally-along the immediately-laterally-adjacent memory blocks.

In some embodiments, a memory array comprising strings of memory cells comprises laterally-spaced memory blocks individually comprising a vertical stack comprising alternating insulative tiers and conductive tiers. Operative channel-material strings of memory cells extend through the insulative tiers and the conductive tiers. Insulative pillars are laterally-between and longitudinally-along immediately-laterally-adjacent of the memory blocks. The pillars are circumferentially-surrounded by and directly against insulative material of the insulative tiers.

In some embodiments, a memory array comprising strings of memory cells comprise laterally-spaced memory blocks individually comprising a vertical stack comprising alternating insulative tiers and conductive tiers. Operative channel-material strings of memory cells extend through the insulative tiers and the conductive tiers. Insulative pillars are laterally-between and longitudinally-along immediately-laterally-adjacent of the memory blocks. The pillars comprise vertically-spaced and radially-projecting insulative rings in the conductive tiers as compared to the insulative tiers.

In some embodiments, a method used in forming a memory array comprising strings of memory cells comprises forming a lower stack comprising vertically-alternating lower insulative tiers and lower conductive tiers. The lower stack comprises lower-laterally-spaced memory-block regions. Lower-elevationally-extending holes are formed in the lower stack that are laterally-between and longitudinally-spaced-along the immediately-laterally-adjacent lower-memory-block regions. Sacrificial material is formed in the lower holes. An upper stack is formed comprising vertically-alternating upper insulative tiers and upper conductive tiers above the lower stack and the sacrificial material. The upper stack comprises upper-laterally-spaced memory-block regions that are directly above the lower-memory-block regions. Upper-elevationally-extending holes are formed in the upper stack that are laterally-between and longitudinally-spaced-along the immediately-laterally-adjacent upper-memory-block regions. The upper holes are atop and expose the sacrificial material in the lower holes. Insulative material of the respective lower insulative tiers and the upper insulative tiers extends around the respective upper and lower holes and laterally across space that is laterally-between the immediately-laterally-adjacent lower-memory-block regions and the immediately-laterally-adjacent upper-memory-block regions. The sacrificial material is removed through the upper holes.

In some embodiments, a method used in forming a memory array comprising strings of memory cells comprises forming a lower stack comprising vertically-alternating lower insulative tiers and lower conductive tiers. The lower stack comprises lower-laterally-spaced memory-block regions. One of (a) and (b) is formed where (a): lower-horizontally-elongated trenches in the lower stack that individually are laterally-between immediately-laterally-adjacent of the lower-memory-block regions and (b): lower-elevationally-extending holes in the lower stack that are laterally-between and longitudinally-spaced-along the immediately-laterally-adjacent lower-memory-block regions. Sacrificial material is formed in the one of said (a) and said (b). An upper stack is formed comprising vertically-alternating upper insulative tiers and upper conductive tiers above the lower stack and the sacrificial material. The upper stack comprises upper-laterally-spaced memory-block regions that are directly above the lower-laterally-spaced memory-block regions. One of (c) and (d) is formed, where (c): upper-horizontally-elongated trenches in the upper stack that are individually laterally-between immediately-laterally-adjacent of the upper-memory-block regions if said (b). The upper trenches if said (b) are atop and expose the sacrificial material in said (b), and (d): upper-elevationally-extending holes in the upper stack that are laterally-between and longitudinally-spaced-along the immediately-laterally-adjacent upper-memory-block regions. The upper holes are atop and expose the sacrificial material in the one of said (a) and (b). The method comprises at least one of said (b) and (d). Insulative material of the respective lower insulative tiers or the upper insulative tiers extends around at least one of said (b) and (d) and laterally across space that is laterally-between the immediately-laterally-adjacent lower-memory-block regions or the immediately-laterally-adjacent upper-memory-block regions. The sacrificial material is removed from the one of said (a) and (b) through the one of said (c) and (d).

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory array comprising strings of memory cells, comprising:
    laterally-spaced memory blocks individually comprising a vertical stack comprising alternating insulative tiers and conductive tiers, operative channel-material strings of memory cells extending through the insulative tiers and the conductive tiers; and
    insulative material of the insulative tiers extending laterally across space that is laterally-between immediately-laterally-adjacent of the memory blocks in a finished operable construction of the memory array, the insulative material having elevationally-extending holes that are laterally-between and longitudinally-along the immediately-laterally-adjacent memory blocks.

2. The memory array of claim 1 wherein the holes extend through all of the alternating insulative and conductive tiers.

3. The memory array of claim 1 wherein the holes do not extend through all of the alternating insulative and conductive tiers, the holes being in an uppermost portion of the alternating insulative and conductive tiers.

4. The memory array of claim 1 wherein the holes do not extend through all of the alternating insulative tiers and conductive tiers, the holes being in a lowermost portion of the alternating insulative and conductive tiers.

5. The memory array of claim 1 wherein the holes are everywhere larger in horizontal cross-section than the channel-material strings.

6. The memory array of claim 1 wherein the holes are at least predominately filled with insulator material.

7. The memory array of claim 6 wherein the insulator material is of a composition the same as the insulative material of the insulative tiers.

8. The memory array of claim 6 wherein the insulator material is of a composition that is different from the insulative material of the insulative tiers.

9. The memory array of 1 wherein the holes are void-space.

10. The memory array of claim 1 wherein the holes are vertical or within 10° of vertical.

11. The memory array of claim 1 wherein the holes are of a circular shape in a horizontal cross-section.

12. The memory array of claim 1 comprising NAND.

13. A memory array comprising strings of memory cells, comprising:
    laterally-spaced memory blocks individually comprising a vertical stack comprising alternating insulative tiers and conductive tiers, operative channel-material strings of memory cells extending through the insulative tiers and the conductive tiers; and
    insulative pillars laterally-between and longitudinally-spaced along immediately-laterally-adjacent of the memory blocks in a finished operable construction of the memory array, the insulative pillars being circumferentially-surrounded by and directly against insulative material of the insulative tiers, the insulative material of the insulative tiers extending laterally across the immediately-laterally-adjacent memory blocks vertically-between immediately-vertically-adjacent of the conductive tiers, some of the insulative material that extends laterally across the immediately-laterally-adjacent memory blocks being laterally-between immediately-adjacent of the insulative pillars.

14. The memory array of claim 13 wherein the insulative pillars are of a circular shape in a horizontal cross-section.

15. The memory array of claim 13 wherein the insulative pillars are at least predominantly of a composition the same as that of the insulative tiers.

16. The memory array of claim 13 wherein the insulative pillars are at least predominantly of a composition that is different from that of the insulative tiers.

17. A memory array comprising strings of memory cells, comprising:
    laterally-spaced memory blocks individually comprising a vertical stack comprising alternating insulative tiers and conductive tiers, operative channel-material strings of memory cells extending through the insulative tiers and the conductive tiers; and
    insulative pillars laterally-between and longitudinally-spaced along immediately-laterally-adjacent of the memory blocks in a finished operable construction of the memory array, the insulative pillars being laterally-between the immediately-laterally-adjacent memory blocks and comprising vertically-spaced and radially-projecting insulative rings that circumferentially-surround portions of individual of the insulative pillars and that project laterally into the immediately-laterally-adjacent memory blocks from there-between in the conductive tiers as compared to the insulative tiers.

18. The memory array of claim 17 wherein the rings are of a circular shape in a horizontal cross-section.

19. The memory array of claim 17 wherein the rings are at least predominantly of a composition the same as that of the insulative tiers.

20. The memory array of claim 17 wherein the rings are at least predominantly of a composition that is different from that of the insulative tiers.

\* \* \* \* \*